United States Patent [19]

Izumi

[11] Patent Number: 6,015,461
[45] Date of Patent: Jan. 18, 2000

[54] SEED CRYSTAL HOLDERS, FOR PULLING A SINGLE CRYSTAL

[75] Inventor: Teruo Izumi, Hyogo pref., Japan

[73] Assignee: Sumitomo Sitix Corporation, Amagasaki City, Japan

[21] Appl. No.: 08/929,118

[22] Filed: Sep. 15, 1997

[51] Int. Cl.[7] .................................................. C30B 35/00
[52] U.S. Cl. ........................... 117/218; 117/200; 117/911
[58] Field of Search ..................................... 117/200, 218, 117/911

[56] References Cited

U.S. PATENT DOCUMENTS 4,594,127  6/1986  Lane et al. ................................. 117/35
5,833,750  11/1998  Mizuishi et al. ........................ 117/218

*Primary Examiner*—Felisa Hiteshew
*Attorney, Agent, or Firm*—Armstrong, Westerman Hattori, McLeland & Naughton

[57] ABSTRACT

When a pulled single crystal becomes heavier, the strength of a seed crystal holder made of a carbon material is not sufficient, leading to falling of the single crystal. On the other hand, a seed crystal holder made of metal causes heavy metal contamination, or the strength thereof deteriorates early because of thermal fatigue. Accordingly, a seed crystal holder, comprising an inner cylindrical body made of metal which directly holds a seed crystal, and a carbon cylindrical body arranged around the inner cylindrical body which covers the periphery thereof, is used.

10 Claims, 16 Drawing Sheets

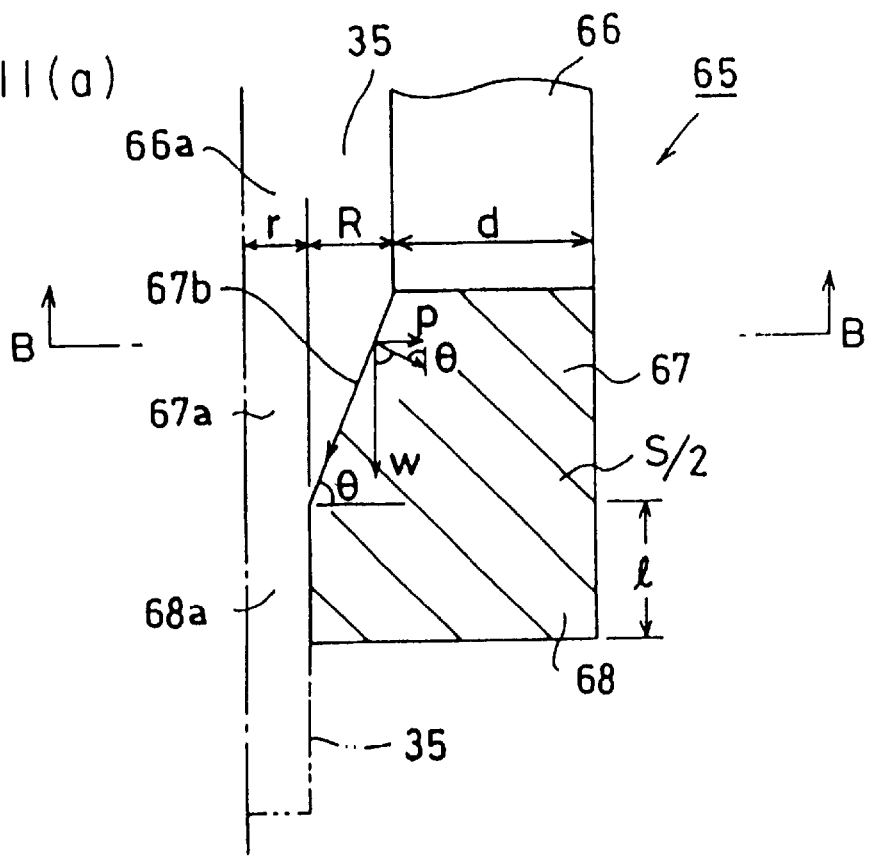
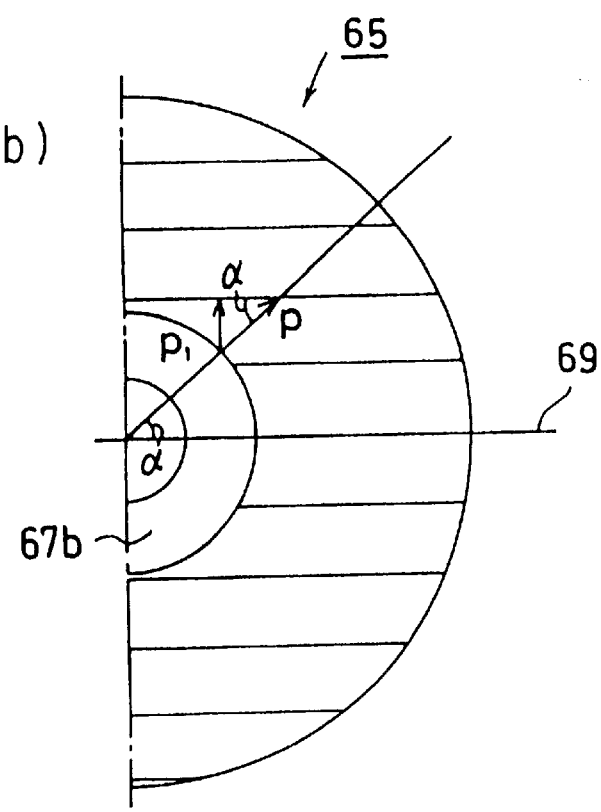
Fig.11(a)
Fig.11(b)

ANGLE θ OF THE INNER WALL SURFACE
TO THE HORIZONTAL PLANE (°)

ANGLE θ OF THE INNER WALL SURFACE
TO THE HORIZONTAL PLANE (°)

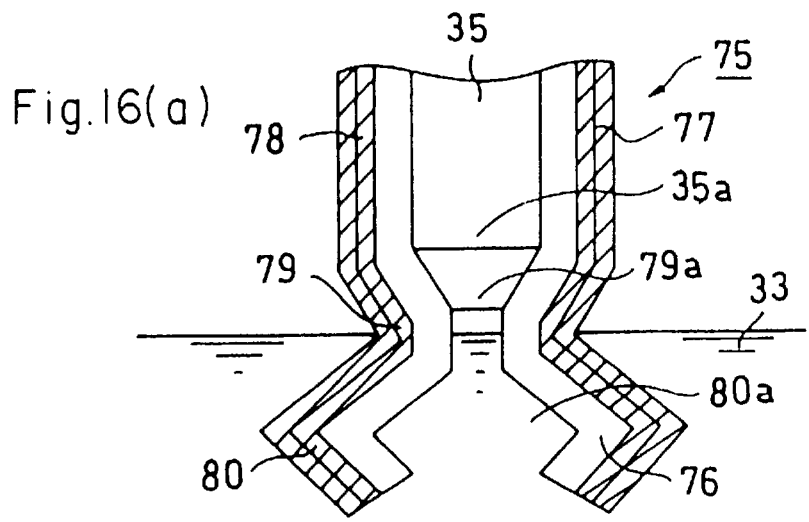
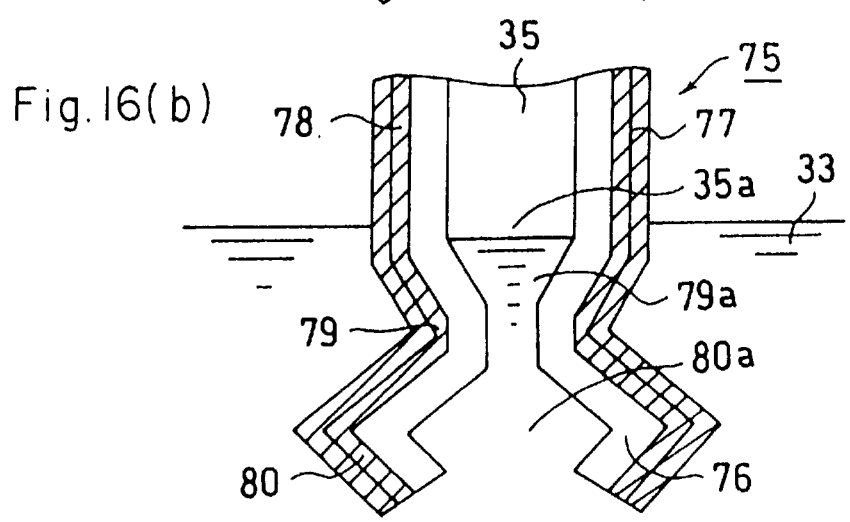
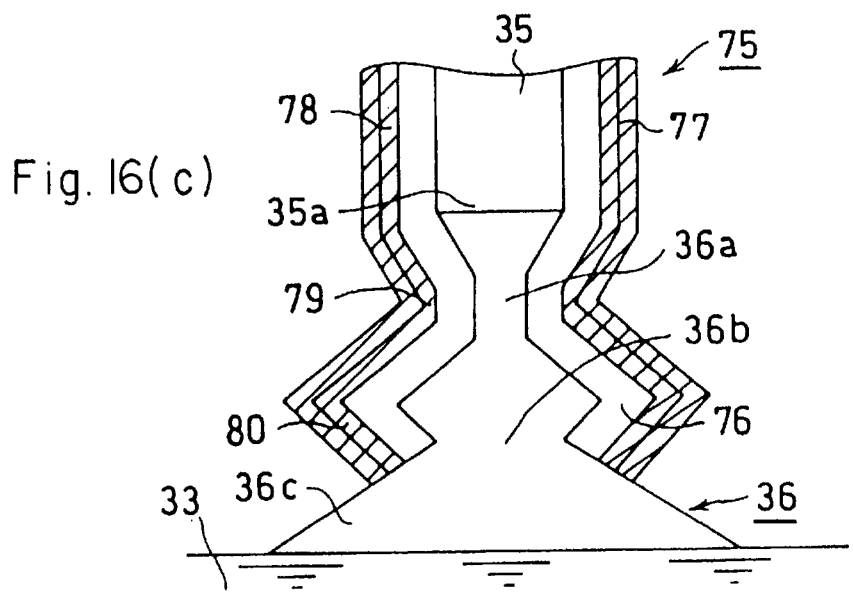

SEED CRYSTAL HOLDERS, FOR PULLING A SINGLE CRYSTAL

BACKGROUND OF THE INVENTION

1. Field of the Invention

The present invention relates to seed crystals, seed crystal holders, and a method for pulling a single crystal and, more particularly, to seed crystals, seed crystal holders, and a method for pulling a single crystal, which are used in growing a single crystal used as a semiconductor material.

2. Description of the Prior Art

There are various methods for growing a single crystal, one of which is a pulling method such as the Czochralski method (hereinafter, referred to as the CZ method). FIG. 1 is a diagrammatic sectional view showing the principal part of an apparatus for pulling a single crystal used for the conventional CZ method, and in the figure, reference numeral 31 represents a crucible.

The crucible 31 comprises a bottomed cylindrical quartz crucible 31a and a bottomed cylindrical graphite crucible 31b fitted on the outer side of the quartz crucible 31a. The crucible 31 is supported with a support shaft 39 which rotates in the direction shown by the arrow A in the figure at a prescribed speed. A heater 32 of a resistance heating type and a heat insulating mould 42 arranged around the heater 32 for promoting heat transmission to the crucible 31 are concentrically arranged around the crucible 31. The crucible 31 is charged with a melt 33 of a material for forming a crystal which is melted by the heater 32.

On the central axis of the crucible 31, a pulling axis 34 made of a pulling rod or wire is suspended, and at the lower end thereof, a seed crystal 35 is held by a seed crystal holder 10.

FIG. 2(a) is a partial sectional view diagrammatically showing a connecting construction of the seed crystal holder 10 in which the seed crystal 35 is inserted and the pulling axis 34, and FIG. 2(b) is a bottom face thereof.

The lower portion 35a of the seed crystal 35 is narrower than a shank portion 35b thereof, and a taper portion 35c thereof is formed between the lower portion 35a and the shank portion 35b.

The lower end portion 34A of the pulling axis 34 is in the form of a cylinder narrower than the body portion 34B thereof, and a groove 34a is formed on the side of the lower end portion 34A.

The seed crystal holder 10 is almost cylindrical, and a taper plane 10a is formed on the lower portion thereof. The seed crystal 35 is inserted in a hollow portion 11a in the lower portion of the seed crystal holder 10, while the lower end portion 34A of the pulling axis 34 is put in a hollow portion 11b in the upper portion of the seed crystal holder 10. A taper plane $11a_{-1}$ is formed in the middle of the hollow portion 11a. The wall surface of the hollow portion 11a is shaped according to the external form of the seed crystal 35 and the cone angle $\theta_1$ of the taper plane $11a_{-1}$ and the cone angle $\theta_2$ of the taper portion 35c of the seed crystal 35 are made to be the same. A groove 10b is formed on the upper side wall surface of the hollow portion 11b.

In order to make the seed crystal holder 10 having the above construction hold the seed crystal 35 and to connect the seed crystal holder 10 holding the seed crystal 35 to the pulling axis 34, the seed crystal 35 is inserted into the hollow portion 11a from the upper side of the seed crystal holder 10. By joining the taper portion 35c of the seed crystal 35 to the taper plane $11a_{-1}$ formed in the hollow portion 11a, the seed crystal 35 is held in the seed crystal holder 10 without dropping down out of the hollow portion 11a. The seed crystal holder 10 is connected to the pulling axis 34 by adjusting the hollow portion 11b of the seed crystal holder 10 to the lower end portion 34A of the pulling axis 34 and screwing the groove 10b formed in the seed crystal holder 10 to the groove 34a formed on the pulling axis 34.

Since the front portion of the seed crystal holder 10 is also exposed to a considerably high temperature when the seed crystal 35 is brought into contact with a melt 33 (about 1400° C. or so), it is necessary to use a material excellent in heat resistance as a material for forming the seed crystal holder 10. And it is difficult to use a metal such as iron, since there is the possibility of the occurrence of heavy metal contamination. Therefore, in general, the seed crystal holder 10 is formed by a carbon material having a high heat resistance.

The above seed crystal holder 10 has a sufficient strength for pulling a single crystal 36 having a diameter of about 6 inches and a weight of 80 kg or so, which has been general hitherto. Recently, however, in order to make semiconductor devices more highly integrated at a lower cost and more efficiently, the wafer has been required to have a larger diameter. Now, for example, the production of a single crystal 36 having a diameter of about 12 inches and a weight of 300 kg or so is desired. In this case, when the seed crystal holder 10 is conventionally made of a carbon material, it cannot withstand the weight of the pulled single crystal 36 and breaks, resulting in the falling of the single crystal 36. The seed crystal holder 10 often breaks almost in parallel to the pulling direction as if to tear. When the seed crystal holder 10 comprises a metal, heavy metal contamination occurs or the strength thereof easily deteriorates by thermal fatigue in an early stage.

In order to solve the above problems, recently, a seed crystal holder made of graphite reinforced with carbon fibers has been used.

FIG. 3(a) is an oblique view diagrammatically showing a seed crystal holder made of graphite reinforced with carbon fiber cloth, and FIG. 3(b) is a sectional view thereof.

The seed crystal holder 45 comprises a large-diameter cylindrical portion 451 having a large-diameter cavity 451a, a small-diameter cylindrical portion 453 having a small-diameter cavity 453a, and the middle portion 452 which joins the large-diameter cylindrical portion 451 to the small-diameter cylindrical portion 453. The inner wall surface 452b of the middle portion 452 is an inclined plane. A groove 451b is formed on the inner wall surface of the large-diameter cylindrical portion 451, to which the front portion of a pulling axis 34 can be screwed. Since the shape of the large-diameter cylindrical portion 451 is not limited as long as it can be connected to the pulling axis 34, there are some cases wherein the groove 451b is not formed.

A seed crystal 35 inserted into the seed crystal holder 45 has an external form which fits into the form of the cavities 451a, 452a, and 453a formed in the seed crystal holder 45.

The seed crystal holder 45 is made of graphite reinforced with carbon fiber cloth, and is manufactured in the below-described manner. By impregnating carbon fiber cloth with a resin and laminating the same, a laminated body made of the resin including the carbon fiber cloth is formed. The laminated body is carbonized (graphitized) by heating it at a high temperature in an inert atmosphere. In this stage, the dipping of the laminated body into a pitch or the like and the step of carbonization are sometimes repeated plural times. The graphite reinforced with carbon fiber cloth is cut in the shape of the seed crystal holder 45, in which the cavities 451a, 452a, and 453a are formed. Then, by treatments such as grinding, the seed crystal holder 45 is manufactured.

The seed crystal holder 45 manufactured through the above steps has a large strength to a force in the vertical direction or in the parallel direction orthogonal to the laminating direction, but has a small tensile strength in the laminating direction, since the carbon fiber cloth for reinforcement is laminated in the parallel direction. Therefore, when a heavy single crystal is pulled, breaks sometimes occur between the laminae because the load of the heavy single crystal works on the inner wall surface 452b through the seed crystal 35.

The graphite reinforced with carbon fiber cloth in which carbon fiber cloth is laminated in the vertical direction is also used as a seed crystal holder, but since the laminating direction is vertical, it has a small strength to a force working in the vertical direction, so that breaks sometimes occur because of the load of the single crystal 36.

Ordinarily, unevenness of 150 μm or more exists on the surface of the seed crystal 35. When a taper portion 35c has a weak place in strength caused by the unevenness, cracks proceed from the place, and the seed crystal 35 cannot withstand the weight of the single crystal 36 and sometimes breaks.

When the vertical section of the taper portion 35c comprises only straight lines, a boundary portion 35d of the taper portion 35c and a small-diameter lower portion 35a has a bending form, on which damage easily occurs if it is not treated carefully. When damage exists on the boundary portion 35d, cracks proceed from the boundary portion 35d in the pulling of the single crystal 36 and the seed crystal 35 sometimes breaks.

One of the important steps in the pulling of the single crystal 36 is the necking step.

Since the dislocation, which occurs in the seed crystal 35 in contact with a melt 33, generally tends to grow in the vertical direction to the growth interface of the single crystal 36, the shape of the growth interface (the front plane of a neck 36a) is made to be downward convex in the necking step, so as to exclude the dislocation.

In the necking step, the faster the pulling speed is made, the smaller the diameter of the neck 36a can be made and the more downward convex the shape of the growth interface becomes. As a result, the dislocation is inhibited from propagating and can be efficiently excluded.

In growing the heavy single crystal 36 having a weight of 300 kg or so, the diameter of the neck 36a needs to be about 6 mm or more in order to prevent the occurrence of troubles such as a fall of the single crystal 36 and to pull the single crystal 36 safely, which is calculated from the silicon strength (about 16 kgf/mm$^2$). However, when the diameter of the neck 36a is 6 mm or more, the dislocation induced in dipping the seed crystal 35 into the melt 33 cannot be sufficiently excluded.

SUMMARY OF THE INVENTION

The present invention was developed in order to solve the above problems, and it is an object of the present invention to provide a seed crystal holder, which can withstand the weight of a seed crystal and does not break even in the pulling of a heavy single crystal, so that the single crystal can be pulled safely and without the occurrence of heavy metal contamination.

In order to achieve the above object, a seed crystal holder (1) according to the present invention is characterized by having an inner cylindrical body made of metal which directly holds a seed crystal, and a carbon cylindrical body arranged around the inner cylindrical body to cover the periphery of the inner cylindrical body.

Using the seed crystal holder (1), since the inner cylindrical body which directly holds the seed crystal is made of metal, even if a large stress works on a taper plane in a hollow portion of the seed crystal holder which is joined to a taper portion of the seed crystal, the stress is received by the inner cylindrical body made of a metal having a large load capacity. As a result, the occurrence of breaks can be prevented. Since the carbon cylindrical body which covers the periphery of the inner cylindrical body is arranged around the inner cylindrical body, the inner cylindrical body is not directly exposed to a high temperature atmosphere in a chamber. Therefore, a metal component of the inner cylindrical body does not evaporate into the atmosphere because of the high temperature, so that the occurrence of heavy metal contamination can be prevented. Since the inner cylindrical body is insulated from the surroundings by the carbon cylindrical body, the early deterioration of the inner cylindrical body caused by heat fatigue is prevented, so that the initial strength of the seed crystal holder can be maintained for a long period of time. Accordingly, even when a heavy single crystal is pulled, the seed crystal holder can withstand the weight of the single crystal and does not break, so that the single crystal can be pulled safely and without the occurrence of heavy metal contamination.

A seed crystal holder (2) according to the present invention is characterized by having a metallic cylindrical body which is buried at least in the portion to surround a seed crystal.

Using the seed crystal holder (2), since the metallic cylindrical body is buried at least in the portion to surround the seed crystal, even if a large stress works on a taper plane in a hollow portion of the seed crystal holder which is joined to a taper portion formed on the seed crystal, the stress is received by the metallic cylindrical body located on the periphery of the seed crystal. As a result, the bearing strength of the taper plane is reinforced, so that the occurrence of breaks can be prevented. Since the metallic cylindrical body is buried in a carbon material or the like, the metallic cylindrical body is not directly exposed to a high temperature atmosphere in a chamber. Therefore, a metal component of the metallic cylindrical body does not evaporate because of the high temperature, so that the occurrence of heavy metal contamination can be prevented. Since the metallic cylindrical body is insulated from heat by the carbon material or the like, the early deterioration caused by heat fatigue is prevented, so that the initial strength of the seed crystal holder can be maintained for a long period of time. Accordingly, even when a heavy single crystal is pulled, the seed crystal holder can withstand the weight of the single crystal and does not break, so that the single crystal can be pulled safely and without the occurrence of heavy metal contamination.

It is one of the objects of the present invention to provide a seed crystal holder made of graphite reinforced with carbon fiber cloth having a construction by which breaks do not occur even in the pulling of a heavy single crystal.

In order to achieve the above object, a seed crystal holder (3) according to the present invention, which is made of graphite reinforced with carbon fiber cloth and has a cavity in the form corresponding to the external form of a seed crystal, is characterized by carbon fibers wound in the circumferential direction at least to the lower outer region and carbon fibers arranged in the vertical direction in the other regions.

The load of a single crystal in the pulling thereof works on an inclined inner wall surface of the seed crystal holder (hereinafter, referred to as the inner wall surface of the middle portion) through the seed crystal which is inserted in the seed crystal holder. The inner wall surface of the middle portion of the seed crystal holder which is in contact with the seed crystal comprises graphite reinforced with carbon fiber cloth in which fiber cloth is arranged in the vertical direction (hereinafter, referred to as graphite reinforced with vertically arranged carbon fiber cloth) and the vertically arranged carbon fiber cloth shows a sufficiently large strength to a component in the vertical direction among internal pressures. On the other hand, since the vertically arranged carbon fiber cloth has a small tensile strength between the laminae, a component in the laminating direction among internal pressures is a problem. However since at least the lower outer region of the seed crystal holder is wound with the carbon fiber cloth in the circumferential direction (hereinafter, referred to as circumferentially arranged carbon fiber cloth), the vertically arranged carbon fiber cloth can compete with the force working between the laminae because of the circumferentially arranged carbon fiber cloth, leading to no occurrence of delamination.

It is one of the objects of the present invention to provide a seed crystal holder made of graphite reinforced with carbon fiber cloth having a shape by which breaks are not caused even in the pulling of a heavy single crystal, and a seed crystal held by the seed crystal holder.

In order to achieve the above object, a seed crystal holder (4) according to the present invention, which is made of graphite reinforced with carbon fiber cloth, comprising the upper portion having a large-diameter cavity, the lower portion having a small-diameter cavity, and the middle portion joining the upper portion to the lower portion, is characterized by having the values of $\theta$, $S$, and $\delta$ chosen so as to satisfy Formula 1, when an angle of the inner wall surface of the middle portion to the horizontal plane, a vertical cross-sectional area of the middle and lower portions, a tensile strength between laminae of graphite reinforced with carbon fiber cloth, and a load of a pulled single crystal are $\theta$, $S$, $\delta$, and $W$, respectively.

$$\pi \sigma S/(\sin\theta \cdot \cos\theta) > W \quad \text{(Formula 1)}$$

When the parameters $\theta$, $S$, and $\delta$ relating to the shape of a seed crystal holder are chosen so as to satisfy Formula 1, the seed crystal holder does not break in the pulling of a single crystal having a weight of W. Therefore, when W is chosen as 300 kg or more, and the material and shape of the seed crystal holder are chosen so as to make the parameters $\theta$, $S$, and $\delta$ satisfy Formula 1, the heavy single crystal having a weight of 300 kg or more can be pulled safely.

A seed crystal holder (5) according to the present invention, defined in the seed crystal holder (4), is characterized by an angle ($\theta$) of the inner wall surface of the middle portion to the horizontal plane chosen in the range of 20–85°.

In the more adequate range, the angle ($\theta$) of the inner wall surface of the middle portion to the horizontal plane is chosen, the more certainly a heavy single crystal can be pulled safely without putting a shear load on the seed crystal or the seed crystal cutting into the seed crystal holder. As a result, the seed crystal holder can be used several times in the pulling of a single crystal.

A seed crystal (1) according to the present invention is characterized by having an external form which fits into the form of the inner wall surface of the seed crystal holder (4) or (5).

Since the seed crystal (1) appropriately fits to the inner wall surface of the seed crystal holder (4) or (5), the seed crystal holder and the seed crystal do not break, so that a heavy single crystal can be certainly pulled.

It is one of the objects of the present invention to provide a seed crystal for pulling a single crystal which does not break even in the pulling of a heavy single crystal having a weight of 300 kg or so.

In order to achieve the above object, a seed crystal (2) according to the present invention is characterized by comprising a large-diameter portion, a small-diameter portion, and the middle portion joining the large-diameter portion to the small-diameter portion, whose vertical sectional form includes curves.

A seed crystal (3) according to the present invention, defined in the seed crystal (2), is characterized by a radius of curvature of the middle portion which is 30–300 mm.

Using the seed crystal (2) or (3), since the vertical sectional form of the middle portion includes curves, the area of the middle portion is larger than that of the middle portion having a vertical sectional form which comprises only straight lines, so that the weight of the single crystal putting on the middle portion per unit area in the pulling of the single crystal is smaller. Since the middle portion and the small-diameter portion are joined with smooth curves, damage is not easily caused on the boundary portion of them and cracks do not proceed from the boundary portion. Therefore, the seed crystal can be prevented from breaking even in the pulling of a heavy single crystal.

A seed crystal (4) according to the present invention is characterized by the unevenness of the surface of a portion bearing the weight of a single crystal, which is controlled to 100 $\mu$m and less.

Using the seed crystal (4), cracks caused by the unevenness hardly proceed, so that the seed crystal can be prevented from breaking even in the pulling of a heavy single crystal.

A seed crystal (5) according to the present invention, defined in the seed crystal (2) or (3), is characterized by the unevenness of the surface of a portion bearing the weight of a single crystal, which is controlled to 100 $\mu$m and less.

Using the seed crystal (5), since the middle portion which bears the weight of the single crystal has a vertical sectional form including curves and the unevenness of the surface thereof is controlled to 100 $\mu$m and less by surface treatments, the weight of the single crystal pulling on the middle portion per unit area in the pulling of the single crystal becomes smaller and no cracks caused by the unevenness proceed. Therefore, the seed crystal can be more efficiently prevented from breaking even in the pulling of a heavy single crystal.

It is one of the objects of the present invention to provide a seed crystal holder and a method for pulling a single crystal using the seed crystal holder, by which a pulled heavy single crystal can be sufficiently held and be pulled safely even when a neck is formed in order to inhibit the dislocation induced in contact of the seed crystal with a melt from propagating.

In order to achieve the above object, a seed crystal holder (6) according to the present invention is characterized by being made of a material resistant to a melt, and including a seed crystal holding portion, a neck formation portion, and a recess formation portion wherein the diameter is increased after the neck formation and is reduced.

Using the seed crystal holder (6), since the seed crystal holder is made of a material resistant to a melt, a polycrystal, which hinders a growth of a single crystal, can be prevented from growing from the surface of the seed crystal holder. By forming a neck in the inner cavity of the neck formation portion using the seed crystal holder holding a seed crystal, the dislocation induced in contact of the seed crystal with the melt can be prevented. By forming a recess in a cavity of the recess formation portion after the neck formation, which is held by the seed crystal holder existing on the periphery thereof, the neck can be prevented from breaking. Since the single crystal formed under the recess is held by the recess whose smallest diameter is larger than the neck, the single crystal can be sufficiently held and be pulled safely even when a heavier single crystal than before is pulled.

A seed crystal holder (7) according to the present invention, defined in the seed crystal holder (6), is characterized by having plural slots formed from the upper portion to the lower portion.

Using the seed crystal holder (7), besides the effects obtained by the seed crystal holder (6), the inner cavity of the seed crystal holder and the outside thereof (within a chamber) can be ventilated through the slots after the seed crystal holder is dipped into the melt, so that the single crystal can be made to grow more easily by preventing the seed crystal from becoming a polycrystal.

A seed crystal holder (8) according to the present invention, defined in the seed crystal holder (6) or (7), is characterized by having boundary portions between slots having a form of an acute angle in the horizontal sectional view.

Using the seed crystal holder (8), besides the effects obtained by the seed crystal holder (6) or (7), since the boundary portions between the slots are in the form of an acute angle in the horizontal sectional view, a crystal does not grow inside the slots and a crystal can be made to grow so as to be in line contact with the point of the boundary portions between the slots, so that the single crystal can be made to grow more easily.

A seed crystal holder (9) according to the present invention, defined in one of the seed crystal holders (6)–(8), is characterized by having an arranged reinforcing material.

Using the seed crystal holder (9), besides the effects obtained by one of the seed crystal holders (6)–(8), the recess can be more certainly held by the seed crystal holder, so that the recess can be prevented from breaking.

A method for pulling a single crystal according to the present invention, wherein a single crystal is made to grow by dipping a seed crystal into a melt within a crucible and then, pulling the seed crystal, is characterized by forming a neck and then, forming a recess by increasing and reducing the diameter within one of the seed crystal holders (6)–(9).

In the method for pulling a single crystal, by forming a neck in the inner cavity of the neck formation portion while preventing a polycrystal from growing from the inner wall surface of the seed crystal holder, the dislocation induced in contact of the seed crystal with the melt can be inhibited from propagating. Since the recess is held by the seed crystal holder existing on the periphery thereof, the neck can be prevented from breaking. Since the single crystal formed under the recess is held by the recess whose smallest diameter is larger than the neck, the single crystal can be sufficiently held and be pulled safely even in the pulling of a heavier single crystal than before.

BRIEF DESCRIPTION OF THE DRAWINGS

FIG. 11(a) is a partial magnified sectional view diagrammatically showing a right half face of the lower portion of a seed crystal holder according to an embodiment, and FIG. 11(b) is a B—B line sectional view of FIG. 11(a);

FIGS. 16(a)–(c) are partial magnified sectional views diagrammatically showing a seed crystal holder and the vicinity thereof in a method for pulling a single crystal according to another embodiment.

DETAILED DESCRIPTION OF THE PREFERRED EMBODIMENTS

The embodiments of the seed crystal holders according to the present invention are described below by reference to those Figures. Here, the same marks are affixed to the constituents having the same functions as those in the conventional example.

The apparatus for pulling a single crystal on which a seed crystal holder according to an embodiment is mounted, is not especially limited. The apparatus for pulling a single crystal used for the CZ method (FIG. 1) may be used, or an apparatus for pulling a single crystal used for the melting method may be used. The seed crystal holders according to the embodiments are described on the assumption that they are used in the pulling of a heavy single crystal having a large diameter of 12 inches or more.

Figure 4A:
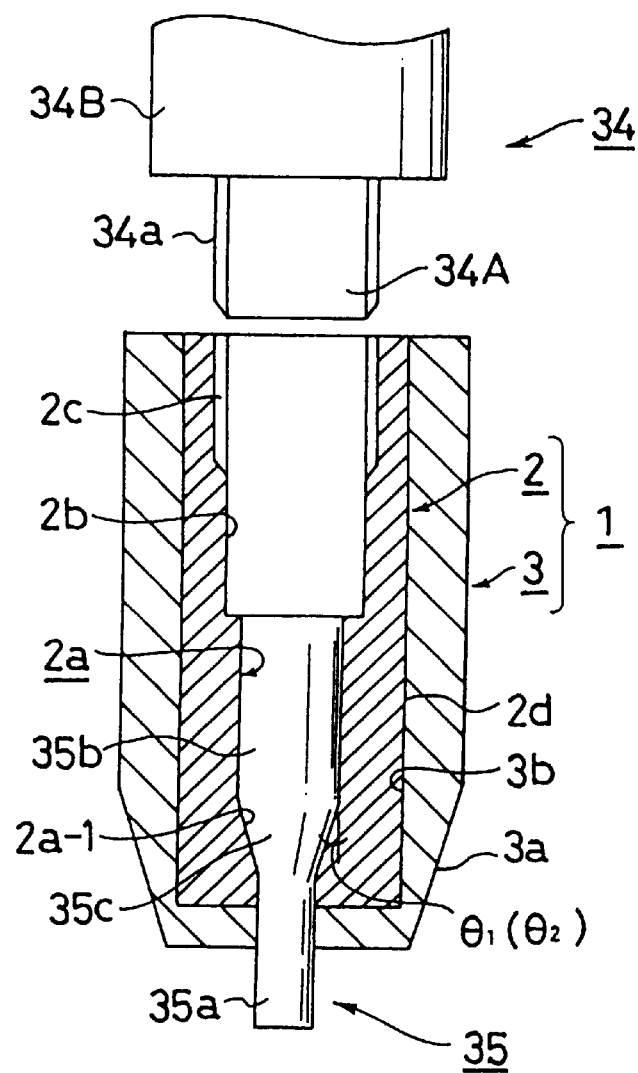
FIG. 4(a) is a partial sectional view diagrammatically showing a connecting construction of a seed crystal holder according to an embodiment in which a seed crystal is inserted and a pulling axis.
Figure 4B:
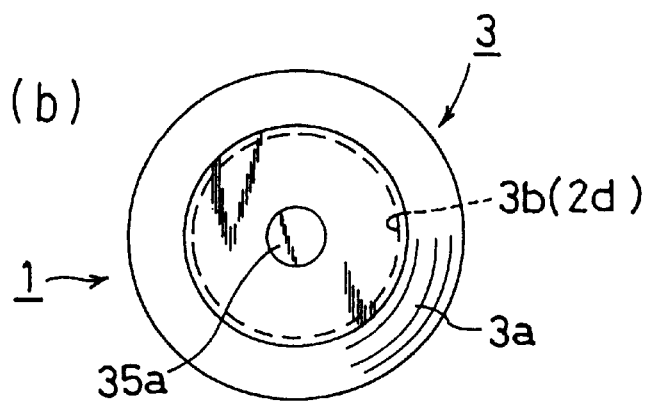
FIG. 4(b) is a bottom face thereof.

FIG. 4(a) is a partial sectional view diagrammatically showing a connecting construction of a seed crystal holder 1 in which a seed crystal 35 is inserted, and a pulling axis 34, and FIG. 4(b) is a bottom face thereof.

Figure 1:
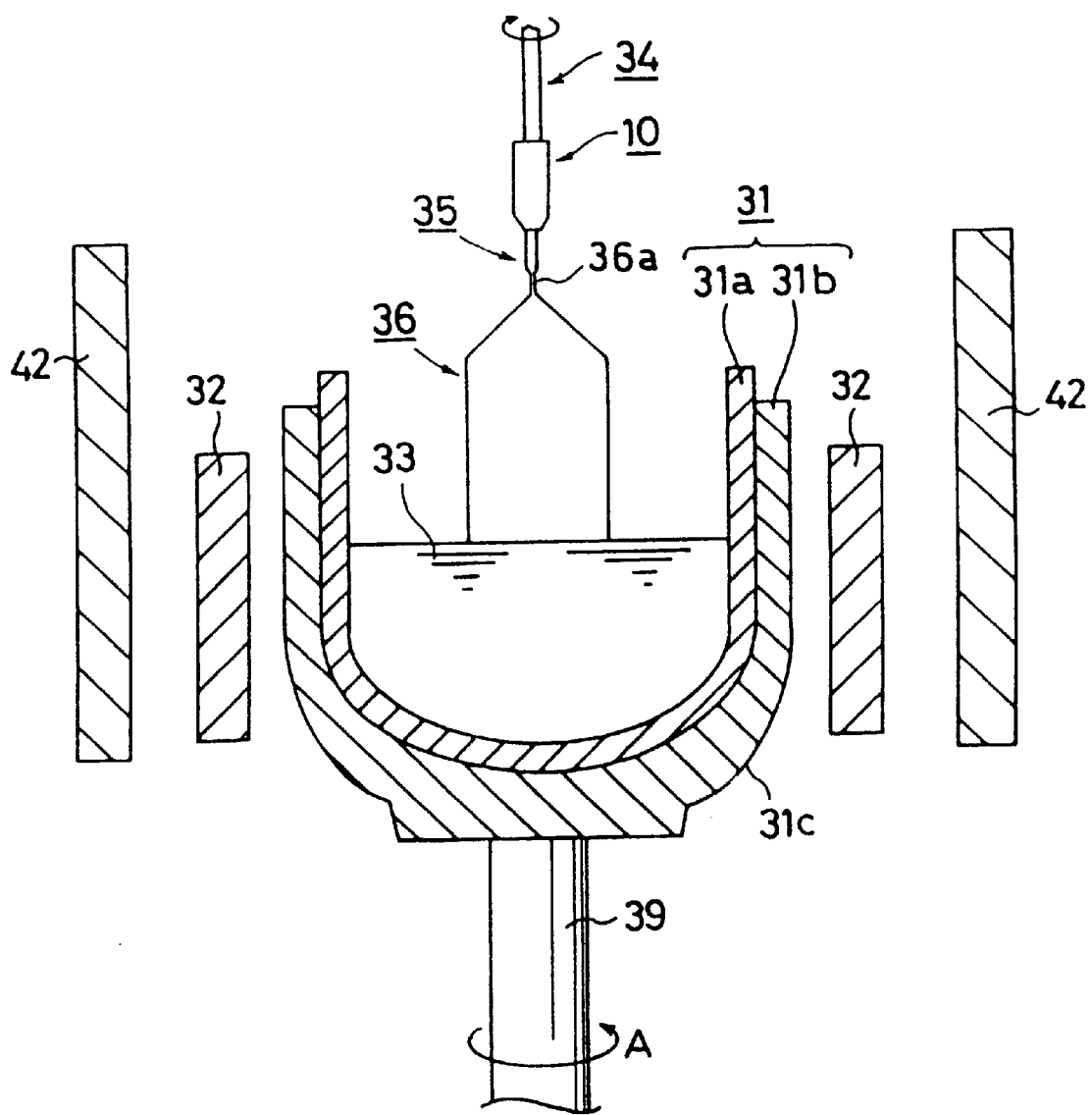
FIG. 1 is a diagrammatic sectional view showing the principal part of an apparatus for pulling a single crystal used for the CZ method.
Figure 2A:
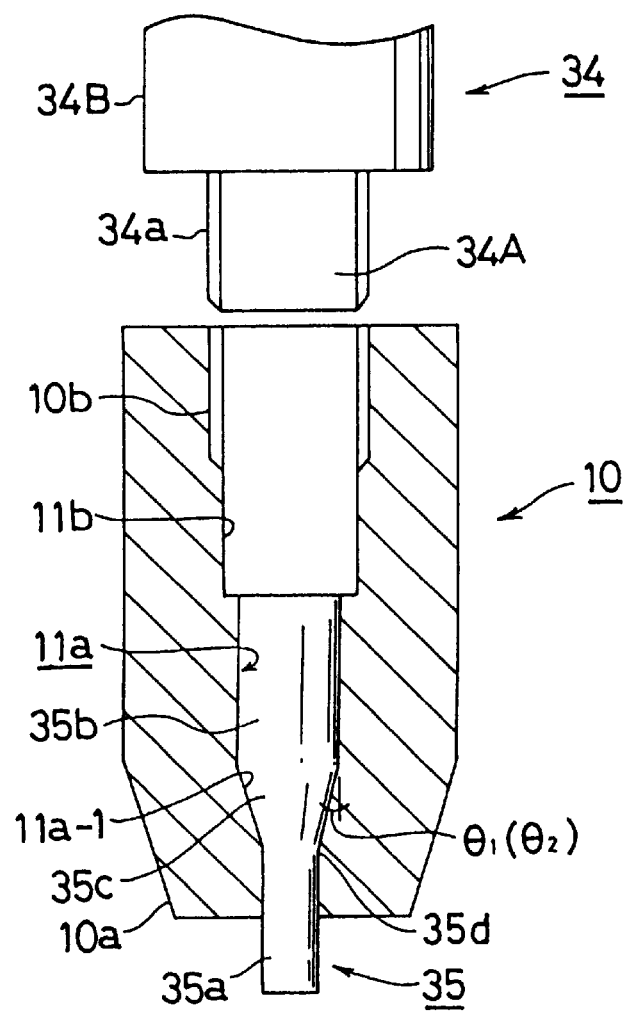
FIG. 2(a) is a partial sectional view diagrammatically showing a connecting construction of a conventional seed crystal holder in which a seed crystal is inserted and a pulling axis.
Figure 2B:
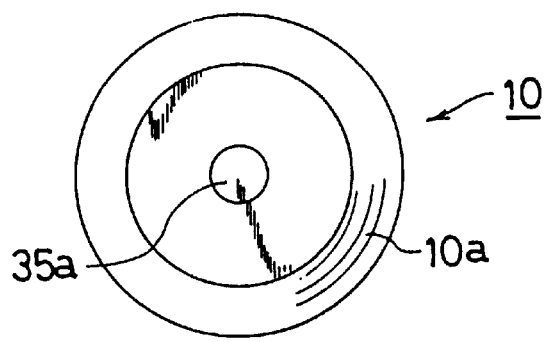
FIG. 2(b) is a bottom face thereof.

Since the constructions of the seed crystal 35 and the pulling axis 34 are the same as those in the conventional example shown in FIGS. 1 and 2, the description thereof is omitted.

The seed crystal holder 1 includes an inner cylindrical body 2 and a carbon cylindrical body 3 covering the periphery 2d of the inner cylindrical body 2. The inner cylindrical body 2 is made of a refractory metal such as tungsten (W) and molybdenum (Mo). The seed crystal 35 is inserted in a hollow portion 2a in the lower portion of the inner cylindrical body 2, while the lower end portion 34A of the pulling axis 34 is put in a hollow portion 2b in the upper portion thereof. A taper plane $2a_{-1}$ is formed in the middle of the hollow portion 2a, and the wall surface thereof is in the form corresponding to the external form of the seed crystal 35. A cone angle $\theta_1$ of the taper plane $2a_{-1}$ and a cone angle $\theta_2$ of a taper portion 35c of the seed crystal 35 are made to be the same. A groove 2c is formed on the upper side wall surface of the hollow portion 2b.

The carbon cylindrical body 3 has a taper plane 3a in the lower portion thereof and is made of a carbon material, C/C material or the like. The form of the inner surface 3b of the carbon cylindrical body 3 is shaped according to the external form of the inner cylindrical body 2. The inner cylindrical body 2 may be joined to the carbon cylindrical body 3 by putting a separately formed inner cylindrical body 2 with a carbon material or C/C material into a mold and sintering the same, or by forming a carbon cylindrical body 3 having the inner surface 3b and pushing a separately formed inner cylindrical body 2 into the carbon cylindrical body 3, or by separately producing an inner cylindrical body 2 having a groove (not shown) which is formed on the outer side wall surface in the upper portion and a carbon cylindrical body 3 having a groove (not shown) which is formed on the inner side wall surface in the upper portion, and screwing the inner cylindrical body 2 into the carbon cylindrical body 3.

The above-described seed crystal holder 1 and pulling axis 34 are connected in the same manner as the conventional one.

Using the above seed crystal holder 1, whose inner cylindrical body 2 directly holding the seed crystal 35 is made of metal, even if a large stress works in the reverse direction to the pulling direction on the taper plane $2a_{-1}$ of the hollow portion 2a in the seed crystal holder 1 which is joined to the taper portion 35c of the seed crystal 35, the stress is received by the inner cylindrical body 2 made of a metal having a large load capacity. As a result, the seed crystal holder 1 can be prevented from breaking. Since the carbon cylindrical body 3 which covers the periphery 2d of the inner cylindrical body 2 is arranged around the inner cylindrical body 2, the inner cylindrical body 2 is not directly exposed to a high temperature atmosphere in a chamber. Therefore, even if the seed crystal holder 1 becomes hot, a metal component of the inner cylindrical body 2 does not evaporate into the atmosphere, leading to the prevention of heavy metal contamination. Since the inner cylindrical body 2 is insulated from the surroundings by the carbon cylindrical body 3, the early deterioration of the inner cylindrical body 2 caused by thermal fatigue is prevented and the initial strength of the seed crystal holder 1 can be maintained for a long period of time. Accordingly, even in the pulling of a heavy single crystal 36, the seed crystal holder 1 can withstand the weight of the single crystal 36 and does not break, so that the single crystal 36 can be pulled safely and without the occurrence of heavy metal contamination.

Figure 5A:
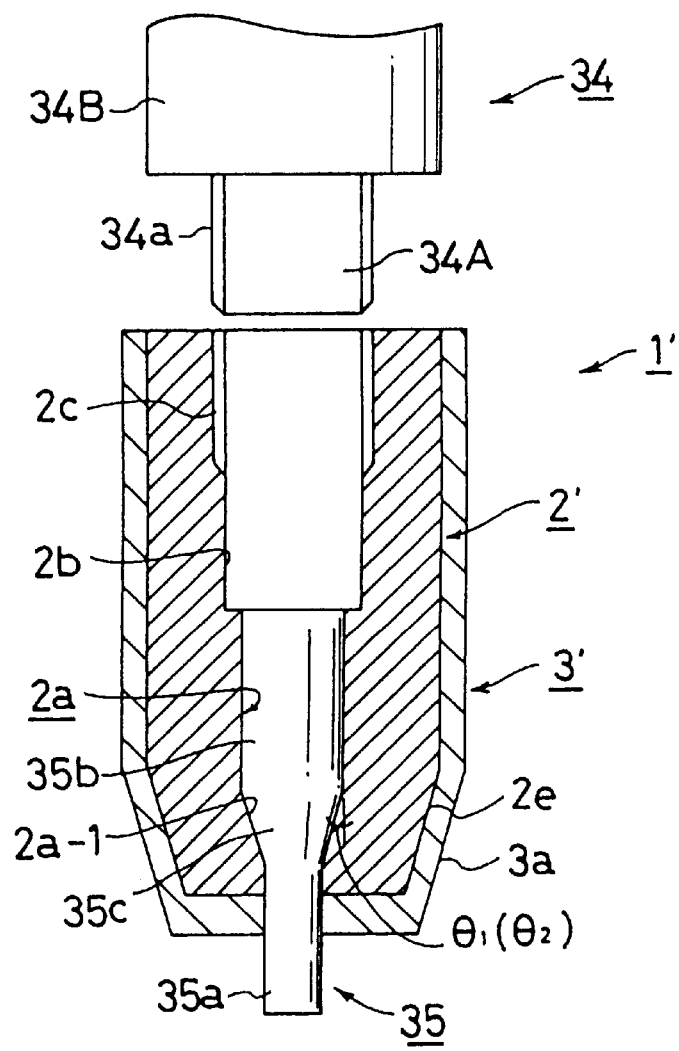
FIG. 5(a) is a partial sectional view diagrammatically showing a connecting construction of a seed crystal holder according to another embodiment in which a seed crystal is inserted and a pulling axis.
Figure 5B:
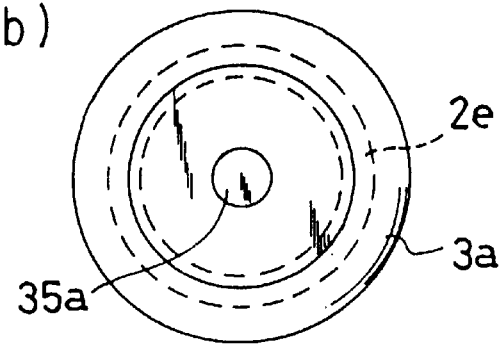
FIG. 5(b) is a bottom face thereof.

In the present embodiment, as shown in FIG. 4, the case wherein the external form of the inner cylindrical body 2 is almost cylindrical, having no taper plane, is described, but it is not limited to that. In another embodiment, as shown in FIG. 5, an inner cylindrical body 2' may have a taper plane 2e parallel to the taper plane $2a_{-1}$. In this case, a carbon cylindrical body 3' may be thinner than that of the seed crystal holder 1 shown in FIG. 4 and be in the form of a film. The thinner the carbon cylindrical body 3' is made and the larger the rate of the inner cylindrical body 2', that is, that of the metal portion is made, the more the strength of a seed crystal holder 1' can be improved.

Figure 6A:
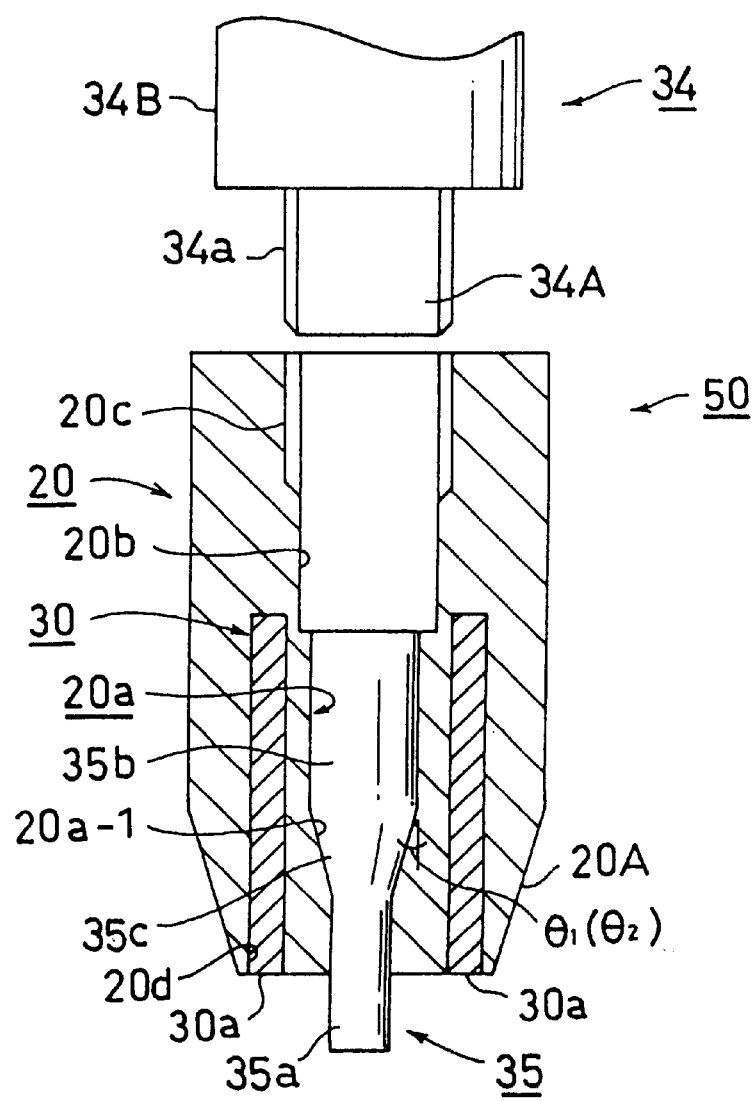
FIG. 6(a) is a partial sectional view diagrammatically showing a connecting construction of a seed crystal holder according to another embodiment in which a seed crystal is inserted and a pulling axis.
Figure 6B:
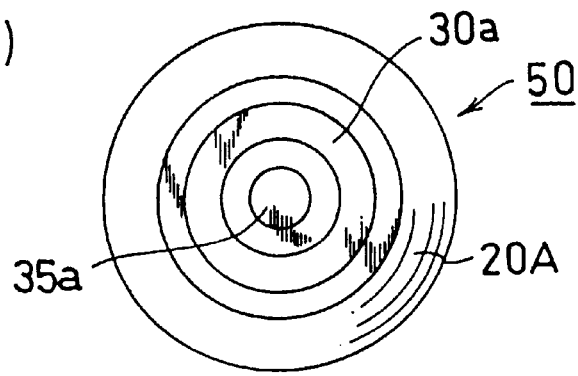
FIG. 6(b) is a bottom face thereof.

FIG. 6(a) is a partial sectional view diagrammatically showing a connecting construction of a seed crystal holder 50 according to another embodiment, in which a seed crystal 35 is inserted, and a pulling axis 34, and FIG. 6(b) is a bottom face thereof.

Since the constructions of the seed crystal 35 and the pulling axis 34 are the same as those in the conventional example, the description thereof is omitted.

The seed crystal holder 50 includes a body 20 having a taper plane 20A in the lower portion thereof, and a metallic cylindrical body 30 buried in the body 20. The body 20 is made of a carbon material, C/C material or the like, while the metallic cylindrical body 30 is made of a metal such as tungsten (W) and molybdenum (Mo).

The seed crystal 35 is inserted in a hollow portion 20a in the lower portion of the body 20, while the lower end portion 34A of the pulling axis 34 is put in a hollow portion 20b in the upper portion of the body 20. A taper plane $20a_{-1}$ is formed in the middle of the hollow portion 20a, and the wall surface thereof is in the form corresponding to the external form of the seed crystal 35. A cone angle $\theta_1$ of the taper plane $20a_{-1}$ and a cone angle $\theta_2$ of a taper portion 35c of the seed crystal 35 are made to be the same. A groove 20c is formed on the upper side wall surface of the hollow portion 20b.

In the lower portion of the body 20, a cylindrical void 20d surrounding the hollow portion 20a is formed, in which the metallic cylindrical body 30 is arranged and fitted.

The metallic cylindrical body 30 may be joined to the body 20 by putting the metallic cylindrical body 30 with a carbon material or C/C material into a mold and sintering the same, or by forming the body 20 having the void 20d and pushing the metallic cylindrical body 30 into the void 20d.

The above-described seed crystal holder 50 is connected to the pulling axis 34 in the same manner as the conventional one.

Using the seed crystal holder 50, since the metallic cylindrical body 30 is buried in the portion which is at the periphery of the seed crystal 35, even if a large stress works in the reverse direction to the pulling direction on the taper plane $20a_{-1}$, the stress is received by the metallic cylindrical body 30. As a result, the bearing strength of the taper plane $20a_{-1}$ is strengthened and the seed crystal holder 50 can be prevented from breaking. Since the metallic cylindrical body 30 is buried in the body 20, the metallic cylindrical body 30 is not directly exposed to a high temperature atmosphere in a chamber. Therefore, even if the seed crystal holder 50 becomes hot, a metal component of the metallic cylindrical body 30 does not evaporate within the chamber, leading to the prevention of heavy metal contamination. Since the metallic cylindrical body 30 is insulated from heat by the body 20, the early deterioration of the metallic cylindrical body 30 caused by thermal fatigue is prevented and the initial strength of the seed crystal holder 50 can be maintained for a long period of time. Accordingly, even in the pulling of a heavy single crystal 36, the seed crystal holder 50 can withstand the weight of the single crystal 36 and does not break, so that the single crystal 36 can be pulled safely and without the occurrence of heavy metal contamination.

Figure 7A:
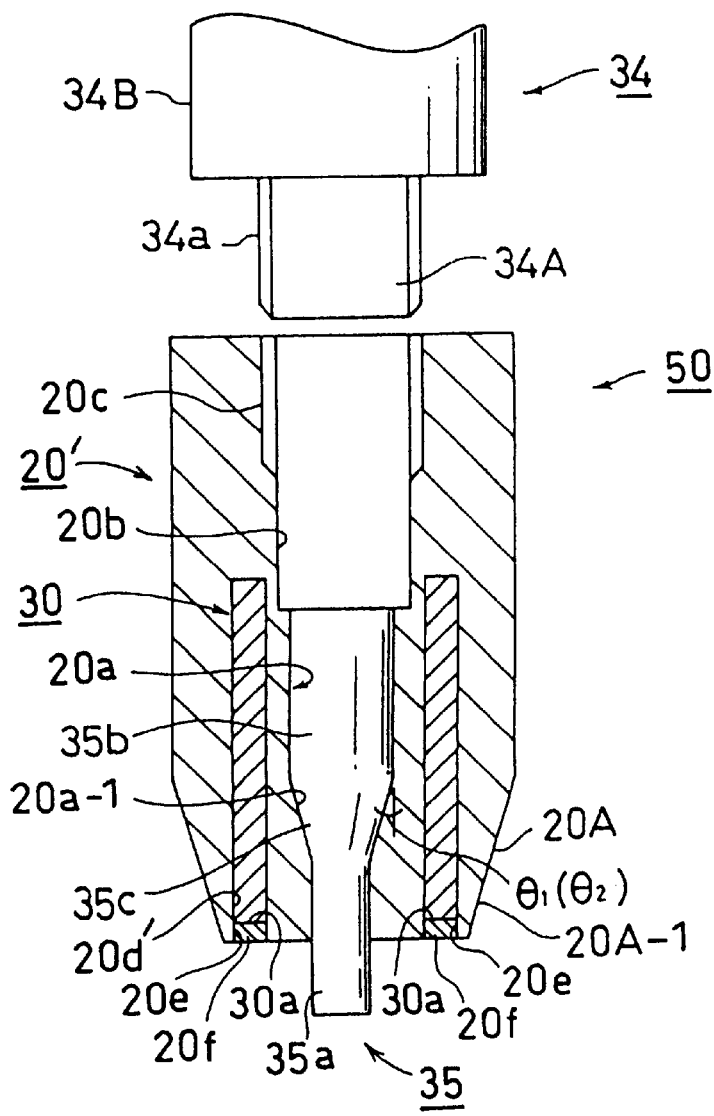
FIG. 7(a) is a partial sectional view diagrammatically showing a connecting construction of a seed crystal holder according to another embodiment in which a seed crystal is inserted and a pulling axis.
Figure 7B:
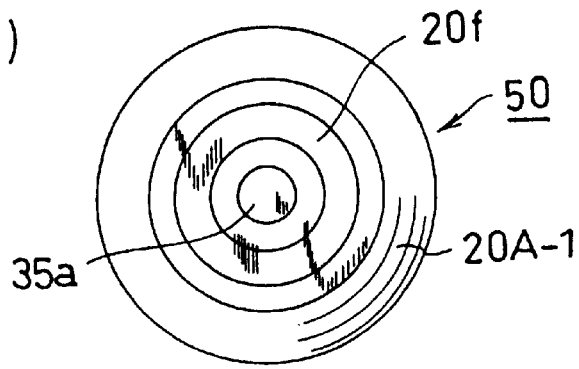
FIG. 7(b) is a bottom face thereof.

In the present embodiment, as shown in FIG. 6, the case wherein the bottom plane 30a of the metallic cylindrical body 30 is exposed is described, but it is not limited to that. In another embodiment, the bottom plane 30a may be covered with the body 20 made of a carbon material or C/C material. As a method for covering the bottom plane 30a, a method wherein the bottom plane 30a is located at a higher place than that in the present embodiment, that is, within the body 20 and is sintered with a carbon material or C/C material, or as shown in FIG. 7, a method wherein a body 20' having a void 20d' which ranges to a higher place than that in the present embodiment is produced, the metallic cylindrical body 30 is pushed into the void 20d' until the bottom plane 30a of the metallic cylindrical body 30 is located at a higher place than the bottom plane of the body 20', and then, a separately formed cover 20f made of a carbon material or C/C material is pushed into a concave portion 20e, may be used.

In the present embodiment, the case wherein the metallic cylindrical body 30 is buried in the periphery of the hollow portion 20a in the lower portion of the body 20, but it is not limited to that. In another embodiment, a longer metallic cylindrical body 30 may be buried not only in the lower portion of the body 20 but also in the periphery of the hollow portion 20b in the upper portion thereof.

Figure 8A:
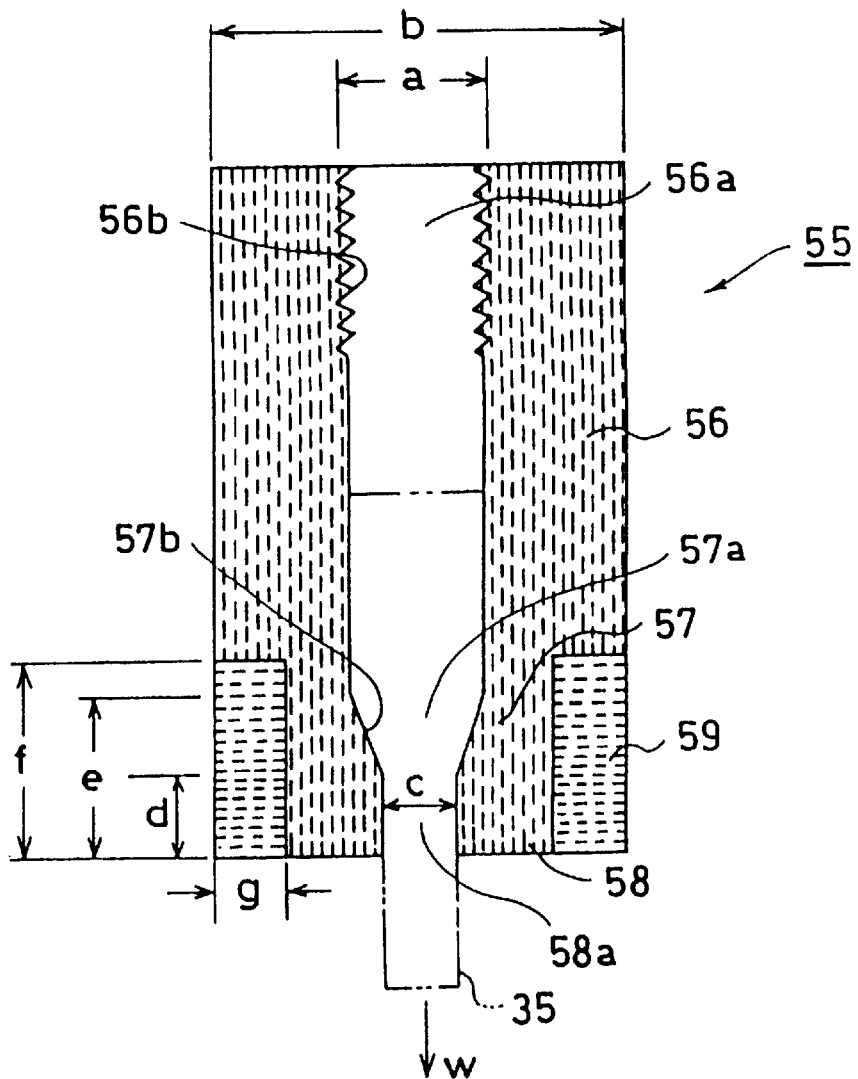
FIG. 8(a) is a diagrammatic sectional view showing a seed crystal holder according to another embodiment of the present invention.
Figure 8B:
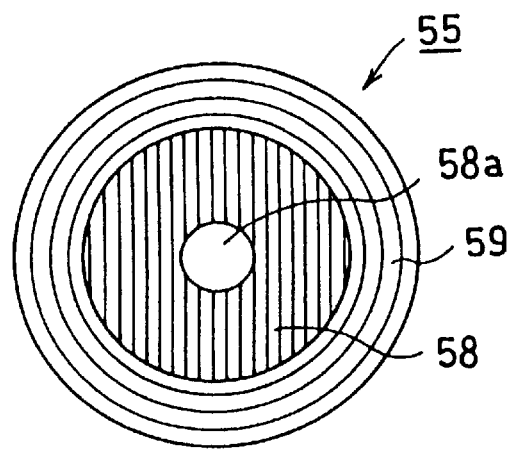
FIG. 8(b) is a bottom face thereof.

FIG. 8(a) is a diagrammatic sectional view showing a seed crystal holder according to another embodiment, and FIG. 8(b) is a bottom face thereof.

The seed crystal holder 55 made of graphite reinforced with carbon fiber cloth comprises a large-diameter cylindrical portion 56 having a large-diameter cavity 56a, a small-diameter cylindrical portion 58 having a small-diameter cavity 58a, and the middle portion 57 which joins the large-diameter cylindrical portion 56 to the small-diameter cylindrical portion 58. The inner wall surface 57b of a cavity 57a in the middle portion 57 is an inclined plane. A groove 56b is formed on the inner wall surface of the large-diameter cylindrical portion 56, to which the front portion 34A of a pulling axis 34 can be screwed. The groove 56b need not be always formed on the large-diameter cylindrical portion 56, as long as it has a construction which enables it to be connected to the front of the pulling axis 34.

The seed crystal holder 55 is made of two sorts of graphite reinforced with carbon fiber cloth. The lower outer region 59 comprises graphite reinforced with circumferentially arranged carbon fiber cloth, while the other regions comprise graphite reinforced with vertically arranged carbon fiber cloth.

One of the methods for producing the seed crystal holder 55 is as follows. That is, after producing a seed crystal holder 45 having the same shape as a conventional one shown in FIG. 3, the portion which is supposed to be the lower outer region 59 is cut out. Carbon fiber cloth impregnated with a resin such as a phenol resin used in the carbonization is wound to the lower outer region 59 and is carbonized, so as to make graphite reinforced with circumferentially arranged carbon fiber cloth.

A seed crystal 35 which is inserted in the seed crystal holder 55 has an external form corresponding to the cavities 56a, 57a, and 58a formed in the seed crystal holder 55.

When a single crystal 36 (FIG. 1) is pulled, the weight W of the single crystal 36 works on the inner wall surface 57b through the seed crystal 35. Since the portion including the inner wall surface 57b is made of graphite reinforced with vertically arranged carbon fiber cloth, it has a large strength to a force in the vertical direction but has a small strength to a force in the laminating direction. However, the lower outer region 59 of the seed crystal holder 55 shown in FIG. 8 comprises graphite reinforced with circumferentially arranged carbon fiber cloth, which can bear the force working in the laminating direction on the graphite reinforced with vertically arranged carbon fiber cloth existing inside thereof. As a result, delamination does not occur in the inner graphite reinforced with vertically arranged carbon fiber cloth, so that a single crystal 36 having a large diameter can be pulled using the seed crystal holder 55.

The lower outer region 59 comprising graphite reinforced with circumferentially arranged carbon fiber cloth need have a sufficient strength for preventing delamination in the portion of graphite reinforced with vertically arranged carbon fiber cloth, so that the lower outer region 59 preferably reaches a higher place than the middle portion 57, that is, part of the large-diameter cylindrical portion 56. Usually, the height (f) of the lower outer region 59 is preferably 1–30 mm or so higher than the height (e) of the small-diameter cylindrical portion 58 and middle portion 57, while the thickness (g) thereof is preferably 5–50% or so of the thickness ((b–a)/2) of the large-diameter cylindrical portion 56.

In the present embodiment, the lower outer region 59 comprises graphite reinforced with circumferentially arranged carbon fiber cloth, but in another embodiment, the lower outer region 59 may comprise graphite reinforced with circumferentially arranged carbon fibers. In this case, after cutting out the portion which is supposed to be the lower outer region 59, a continuous carbon fiber impregnated with a phenol resin or the like may be wound to the lower outer region 59 and be carbonized.

Figure 9:
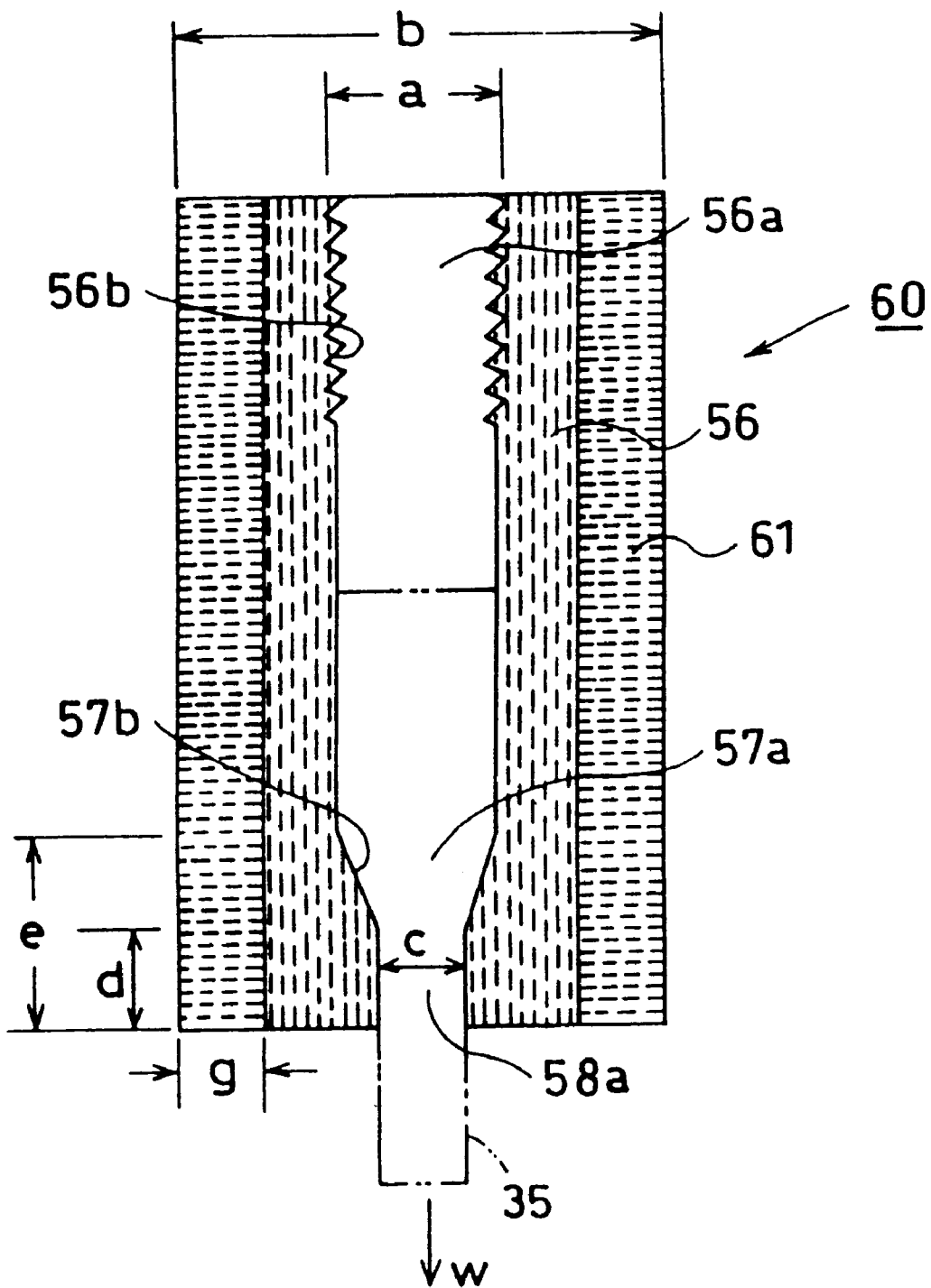
FIG. 9 is a diagrammatic sectional view showing a seed crystal holder according to another embodiment.

FIG. 9 is a diagrammatic sectional view showing a seed crystal holder according to still another embodiment.

The shape of cavities 56a, 57a, and 58a formed in the seed crystal holder 60 is the same as that in the seed crystal holder 55 shown in FIG. 8. The periphery of the cavities 56a, 57a, and 58a comprises graphite reinforced with vertically arranged carbon fiber cloth. However, the whole outer region 61 comprises graphite reinforced with circumferentially arranged carbon fiber cloth or graphite reinforced with circumferentially arranged carbon fibers, differently from the seed crystal holder 55.

The thickness (g) of the outer region 61 is preferably 5–50% of the total thickness ((b–a)/2) of the large-diameter cylindrical portion 56 and outer region 61.

A method for producing the seed crystal holder 60 shown in FIG. 9 is easier than that for producing the seed crystal holder 55 shown in FIG. 8. That is, after producing the large-diameter cylindrical portion 56 whose diameter is smaller than that of the seed crystal holder 55 and else shown in FIG. 8, carbon fiber cloth impregnated with a resin or a continuous carbon fiber may be wound around it and be carbonized, so that the outer region 61 comprising graphite reinforced with carbon fiber cloth or graphite reinforced with carbon fibers may be formed.

In this case, too, the outer region 61 comprises graphite reinforced with circumferentially arranged carbon fiber cloth, which can bear the force working in the lamination direction on the portion of graphite reinforced with vertically arranged carbon fiber cloth existing inside thereof. As a result, delamination does not occur in the inner graphite reinforced with vertically arranged carbon fiber cloth.

Figure 10:
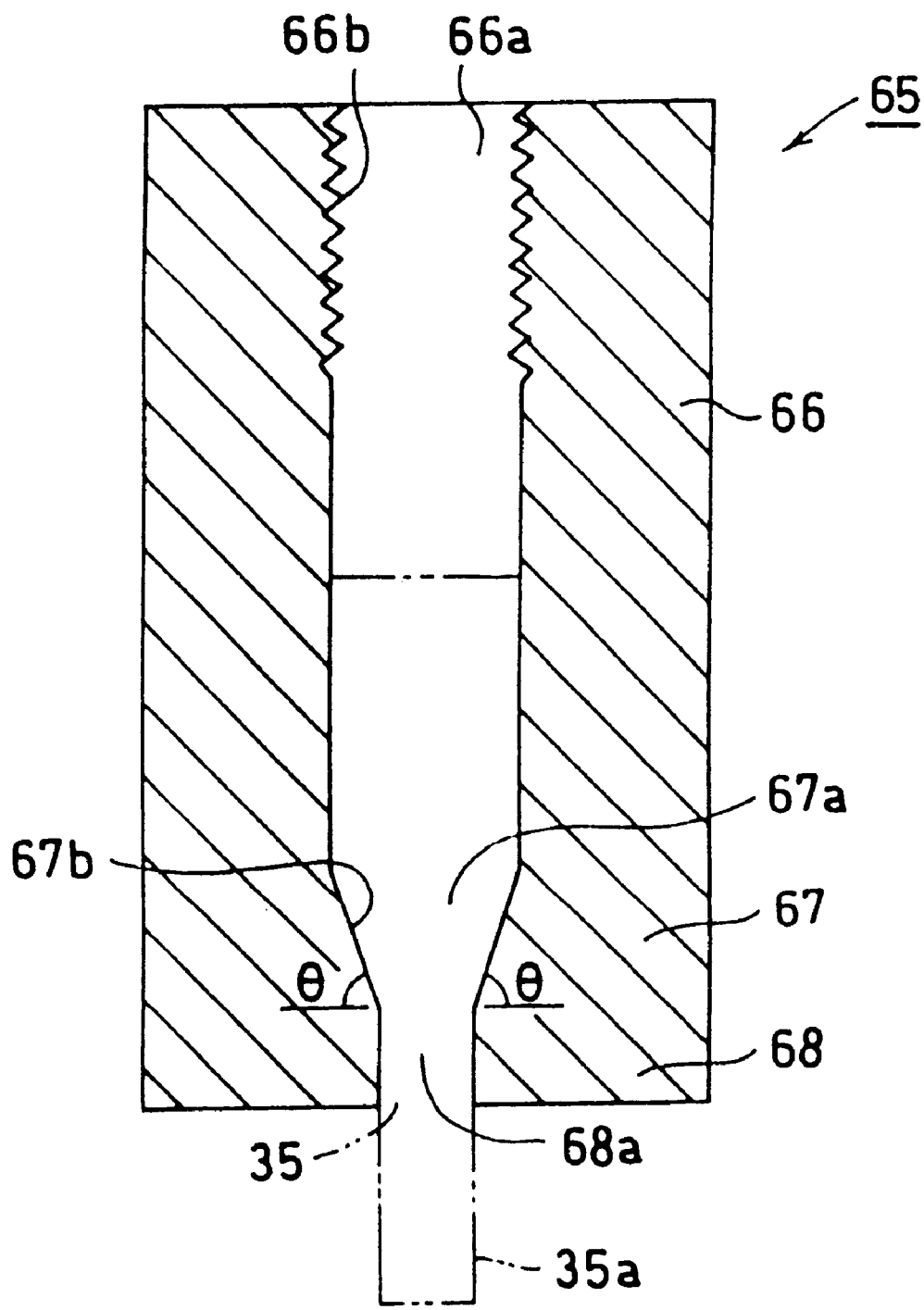
FIG. 10 is a diagrammatic sectional view showing a seed crystal holder according to another embodiment of the present invention.

FIG. 10 is a diagrammatic sectional view showing a seed crystal holder according to still another embodiment.

The seed crystal holder 65 made of graphite reinforced with carbon fiber cloth comprises the upper portion 66 having a large-diameter cavity 66a, the lower portion 68 having a small-diameter cavity 68a, and the middle portion 67 which joins the upper portion 66 to the lower portion 68. The inner wall surface 67b of a cavity 67a in the middle portion 67 is an inclined plane. An angle (θ) which the inner wall surface 67b and the horizontal plane make is described below. A groove 66b is formed on the inner wall surface of the upper portion 66, to which the front portion of a pulling axis 34 can be screwed. The groove 66b need not be always formed on the upper portion 66, as long as it has a construction which enables it to be connected to the front of the pulling axis 34. The seed crystal holder 65 has a large diameter and a shape which enables it to hold a single crystal 36 even in the pulling of a heavy single crystal. The shape of the seed crystal holder 65 is described below in more detail by reference to FIG. 11.

FIG. 11(a) is a partial magnified sectional view diagrammatically showing a right half face of the lower portion of the seed crystal holder according to the embodiment, and FIG. 11(b) is a B—B line sectional view of FIG. 11(a).

As described in the Prior Art, the seed crystal holder 65 made of graphite reinforced with carbon fiber cloth has a large strength to the stress working in any direction except the vertical direction, since the carbon fiber cloth thereof is laminated in the horizontal direction. Therefore, when the graphite reinforced with carbon fiber cloth can bear the tensile stress working in the laminating direction, it does not break. Here, the stress which works on the seed crystal holder 65 through the seed crystal 35 is examined.

In the seed crystal holder 65 having a shape shown in FIG. 10 or 11, the gravity of the single crystal 36 (FIG. 1) through the seed crystal 35 works on the inner wall surface 67b of the middle portion 67. Here, as prior conditions, the gravity of the single crystal 36 working on the inner wall surface 67b (in the strict sense, the total gravity of the single crystal 36 and seed crystal 35) is symmetrical to the axis and the gravity of the single crystal 36 is uniformly held on the whole inner wall surface 67b. And the load which does not cause breaks between laminae even if the gravity of the single crystal 36 works on the inner wall surface 67b of the middle portion 67, is regarded as a load capacity of the seed crystal holder 65.

The gravity working on the single crystal 36 causes an internal pressure (p·d α) on the inner wall surface 67b through the seed crystal 35. The tensile stress between laminae caused by this internal pressure (hereinafter, referred to as the tensile stress between laminae) works on a break plane 69 (in the direction orthogonal to the plane where breaks occur) (in the vertical direction to the break plane 69 in FIG. 11(b)), and a mechanism that when the tensile stress between laminae exceeds a prescribed value, delamination occurs between the laminae, leading to breaks, is supposed.

The tensile stress between laminae is examined here.

In FIG. 11(b), when a load which a microangle dα in the sectional portion bears is w, and a gravity which works on a single crystal is W, the relationship between w and W can be expressed in Formula 2.

$$w = W \cdot (d\alpha/2\pi) \quad \text{(Formula 2)}$$

The relationship between the load w and an internal pressure p is expressed in Formula 3, as shown in FIG. 11(a).

$$p = w \cdot \sin\theta \cdot \cos\theta \quad \text{(Formula 3)}$$

A force $p_1$ working in the direction of tensile stress between laminae (the direction orthogonal to the break plane 69) in the internal pressure p, is expressed in Formula 4 as shown in FIG. 11(b).

$$p_1 = p \cdot \sin\alpha \quad \text{(Formula 4)}$$

Here, by substituting Formulas 2 and 3 for Formula 4, Formula 5 is drawn.

$$p_1 = (W/2\pi) \cdot \sin\theta \cdot \cos\theta \cdot \sin\alpha \, d\alpha \quad \text{(Formula 5)}$$

The total strength $P_1$ of the tensile stress between laminae is expressed by the sum total of $p_1$ at all of the angles in the region above the break plane 69 in FIG. 11(b), so that α in Formula 5 may be integrated in the angle region of 0<α<π. The total strength $P_1$ is expressed in Formula 6.

$$P_1 = \int_0^\pi \left(\frac{W}{2\pi}\sin\theta \cdot \cos\theta\right)\sin\alpha \, d\alpha \quad \text{(Formula 6)}$$
$$= \frac{W}{\pi}\sin\theta \cdot \cos\theta$$

The total strength $P_1$ of the tensile stress between laminae is received by the break plane 69 of the middle portion 67 and lower portion 68, and when the cross-sectional area thereof is S, and the tensile strength between laminae (per unit area) of graphite reinforced with carbon fiber cloth is δ, the tensile strength between laminae of the seed crystal holder 65 is expressed in Formula 7. Here, the cross-sectional area shown in FIG. 11(a) is S/2. The cross-sectional area S/2 is expressed in Formula 8 using the marks shown in FIG. 11(a).

$$t = \sigma S \quad \text{(Formula 7)}$$
$$S/2 = (R+d)1 + R(R/2+d)\tan\theta \quad \text{(Formula 8)}$$

The condition under which the seed crystal holder 65 can hold the seed crystal 35 (the single crystal 36) without having delamination, is that the tensile strength between laminae t is larger than the total strength $P_1$ of the tensile between laminae, so that Formula 9 is drawn from Formulas 6 and 7. Rearranging Formula 9, Formula 1 is obtained.

$$(W/\pi) \cdot \sin\theta \cdot \cos\theta < \sigma S \quad \text{(Formula 9)}$$

$$\pi\sigma S/(\sin\theta \cdot \cos\theta) > W \quad \text{(Formula 1)}$$

When the gravity of the single crystal 36 is W, the seed crystal holder 65 does not break in the pulling of the single crystal 36 by choosing θ, S, and δ of the seed crystal holder 65 so that Formula 1 is satisfied. Therefore, the value on the left side in Formula 1 is regarded as a load capacity.

The tensile strength between laminae δ of graphite reinforced with carbon fiber cloth is usually 0.03 kgf/mm² or so. When the cross-sectional area S of the middle portion 67 and lower portion 68 is 1000 mm², the relationship between the angle θ of the inner wall surface 67b to the horizontal plane and the load capacity is indicated in a graph shown in FIG. 12.

Figure 12:
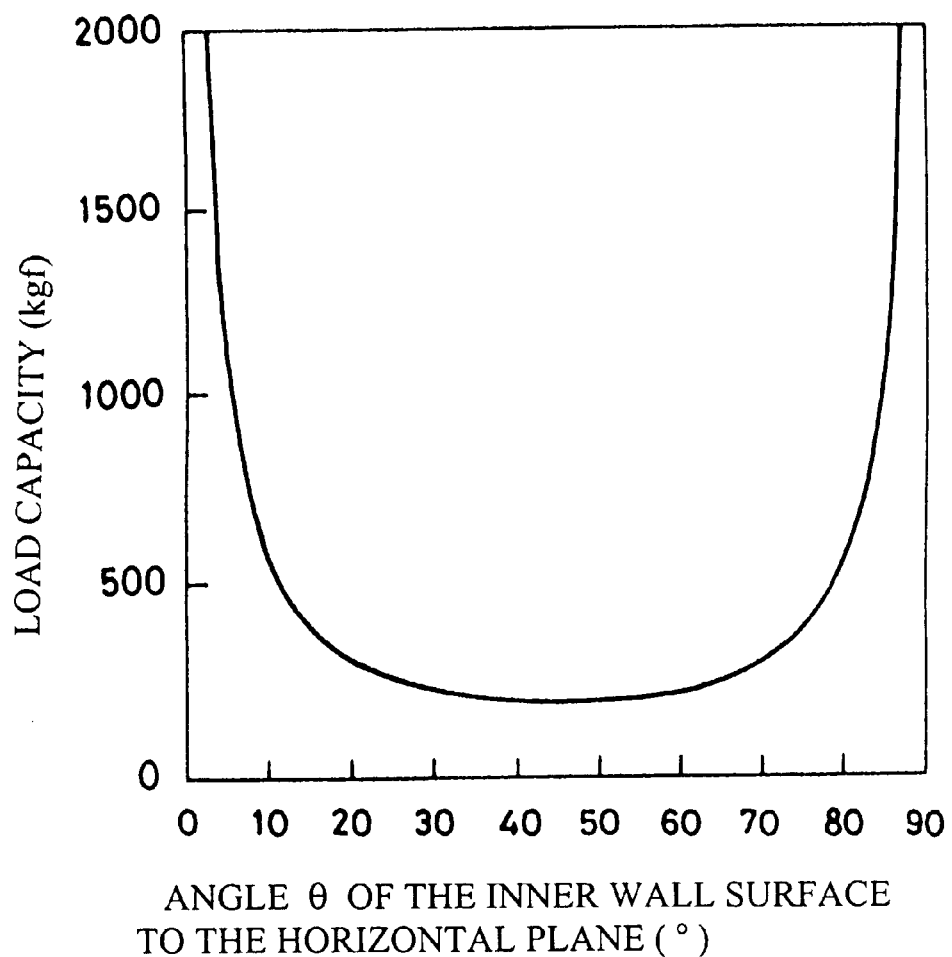
FIG. 12 is a graph indicating the relationship between the angle θ of the inner wall surface to the horizontal plane and the load capacity, when the tensile strength δ between the laminae of a seed crystal holder is 0.03 kgf/mm$^2$ and the vertical cross-sectional area S of the middle and lower portions is 1000 mm$^2$.

In the graph shown in FIG. 12, the load capacity becomes larger as the angle θ of the inner wall surface 67b to the horizontal plane approaches 0° or 90°, while the load capacity becomes smaller as the angle θ approaches 45°.

Therefore, it is simply considered that the angle θ of the inner wall surface 67b to the horizontal plane may be a value close to 0° or 90°. When the angle θ is chosen in the range of 0–20°, the seed crystal holder 65 has a sufficiently large load capacity. However, it is not preferable, because a shear load locally works on the bending portion of the seed crystal 35, that is, the portion where the seed crystal 35 is in contact with the boundary of the middle portion 67 and the lower portion 68 of the seed crystal holder 65, so that the seed crystal 35 easily breaks. From the experiences by this time, when the angle θ of the inner wall surface 67b to the horizontal plane is 85° or more, the seed crystal 35 cuts into the seed crystal holder 65 and is not easily disconnected. It is not preferable because the seed crystal holder 65 cannot be reused.

Figure 13:
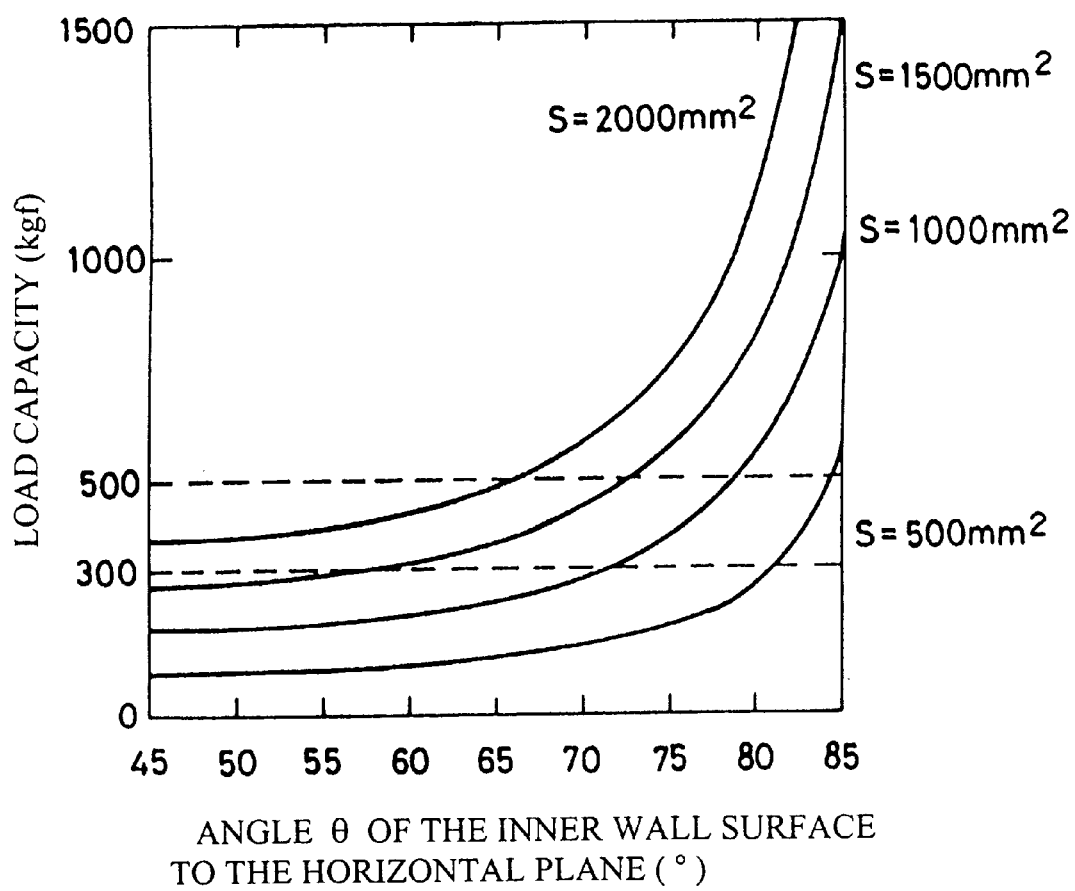
FIG. 13 is a graph indicating the relationship between the load capacity and the angle θ when the vertical cross-sectional area S of the middle and lower portions is changed in the range of the angle θ of the inner wall surface to the horizontal plane of 45–85°.

FIG. 13 is a graph indicating the relationship between the load capacity and the angle θ when the vertical cross-sectional area S of the middle portion 67 and lower portion 68 is 500, 1000, 1500, or 2000 mm² in the range of 45–85° of the angle θ of the inner wall surface 67b to the horizontal plane. The dotted lines show the load capacity levels of 300 kgf and 500 kgf. As obvious from the graph shown in FIG. 13, when the angle θ of the inner wall surface 67b to the horizontal plane is 45° or more, the larger the vertical cross-sectional area S of the middle portion 67 and lower portion 68 and the angle θ become, the larger the load capacity becomes. In the cases wherein the vertical cross-sectional area S is 1000 mm² and the angle θ is about 72° or more, and the vertical cross-sectional area S is 1500 mm² and the angle θ is about 57° or more, each load capacity is 300 kgf or more, so that a heavy single crystal 36 having a large diameter can be pulled. When a load capacity of 500 kgf is chosen in consideration of safety, in the cases wherein the vertical cross-sectional area S is 1000 mm² and the angle θ is about 80° or more, and the vertical cross-sectional area S is 1500 mm² and the angle θ is about 73° or more, each load capacity is 500 kgf or more.

The seed crystal 35, which is inserted into the seed crystal holder 65 having the above construction, has a shape corresponding to that of the inner wall surface of the seed crystal holder 65. As long as a neck 36a (FIG. 1) which grows from the seed crystal 35 can bear the load of a heavy single crystal 36, such a heavy single crystal 36 can be pulled. Therefore, the diameter (2 r) of the lower portion 35a of the seed crystal 35 is usually 14 mm or more. Using the seed crystal 35, the single crystal 36 can be also pulled by a method wherein the neck 36a is not formed.

Figure 14:
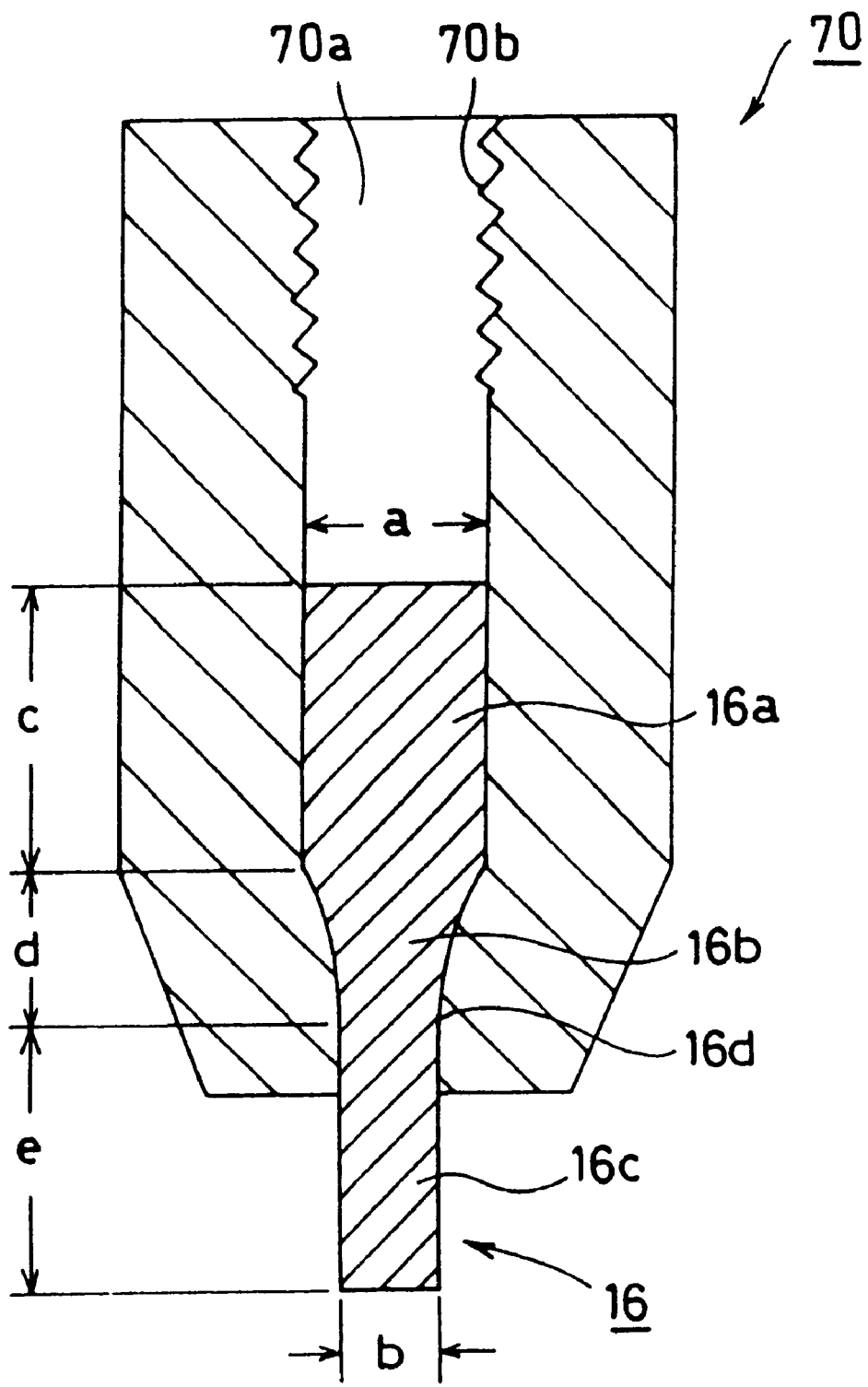
FIG. 14 is a diagrammatic sectional view showing a seed crystal for pulling a single crystal which has no straight bending portion in the vertical sectional form of the middle portion thereof and a seed crystal holder in which the seed crystal for pulling a single crystal is inserted according to another embodiment of the present invention.

FIG. 14 is a diagrammatic sectional view showing a seed crystal for pulling a single crystal and a seed crystal holder in which the seed crystal is inserted according to another embodiment.

The seed crystal 16 includes a large-diameter portion 16a, a small-diameter portion 16c, and the middle portion 16b which joins the large-diameter portion 16a to the small-diameter portion 16c. The vertical sectional form of the middle portion 16b includes curves which widen toward the upper end, and in a boundary portion 16d, the middle portion 16b and the small-diameter portion 16c are smoothly joined with a curved surface, and without a rectilinear bending portion, so that damage caused by treatments does not easily occur. That is, the perpendicular lines of the curves included in the vertical section of the middle portion 16b are made to correspond to straight lines included in the vertical section of the small-diameter portion 16c in the vicinity of the boundary portion 16d, so that the boundary portion 16d is smooth.

On the other hand, the seed crystal holder 70 has a cavity 70a formed in the central portion, and the lower portion of the cavity 70a is in the form corresponding to the external form of the seed crystal 16 so as to allow the seed crystal 16 to fit therein. In the upper portion of the seed crystal holder 70, a groove 70b is formed, to which the front portion of a pulling axis 34 can be screwed. The diameter of the small-diameter portion 16c of the seed crystal 16 is 14 mm or more. The upper portion of the seed crystal holder 70 is needed only to have a form which enables it to connect to the pulling axis 34. In place of the groove 70b, through holes may be formed in the horizontal direction, through which a rod may be passed so as to be hooked on the front portion of the pulling axis 34.

The seed crystal 16 can sufficiently withstand the weight of a heavy single crystal 36 (FIG. 1). In this case, the weight of the pulled single crystal 36 is received by the middle portion 16b whose vertical sectional form includes curves (such as part of a circle). The periphery area is larger compared with the case wherein the vertical sectional form of the middle portion 16b is formed only by straight lines. Therefore, the weight of the single crystal 36 which the middle portion 16b receives per unit area in the pulling of the single crystal becomes smaller.

The vertical sectional form of the middle portion 16b is not especially limited to that. The forms including such as an arc and part of an oval are exemplified. When the vertical sectional form of the middle portion 16b includes an arc, the radius of curvature is preferably 30–300 mm. The diameter of the small-diameter portion 16c is preferably 6–30 mm, while that of the large-diameter portion 16a is preferably 10–50 mm.

Since the vertical sectional form of the middle portion 16b and boundary portion 16d includes curves and the periphery area of the middle portion 16b is larger than before, the weight of the single crystal 36 which the middle portion 16b receives per unit area becomes smaller, so that a probability of breaks of the seed crystal 16 is lowered without any special surface treatment. However, by treating the surface of the seed crystal 16, the probability of breaks of the seed crystal 16 can be more lowered. The unevenness of the surface of the seed crystal 16 after the surface treatment is preferably 100 μm and less, and more preferably 50 μm. The seed crystal 16 is manufactured by cutting a single crystal for forming a seed crystal 16. The seed crystal 16 is treated by grinding it using sandpaper, a whetstone or the like, dipping it into fluorine nitrate, and washing it.

Even the seed crystal 35 whose taper portion 35c has a vertical sectional form including only straight lines as shown in FIG. 2, has a lower probability of breaks in the pulling of a single crystal 36 by treating the surface of the seed crystal 35 so as to make the unevenness thereof smaller. In this case, the unevenness of the treated portion is preferably 100 μm and less, and more preferably 50 μm.

Figure 15A:
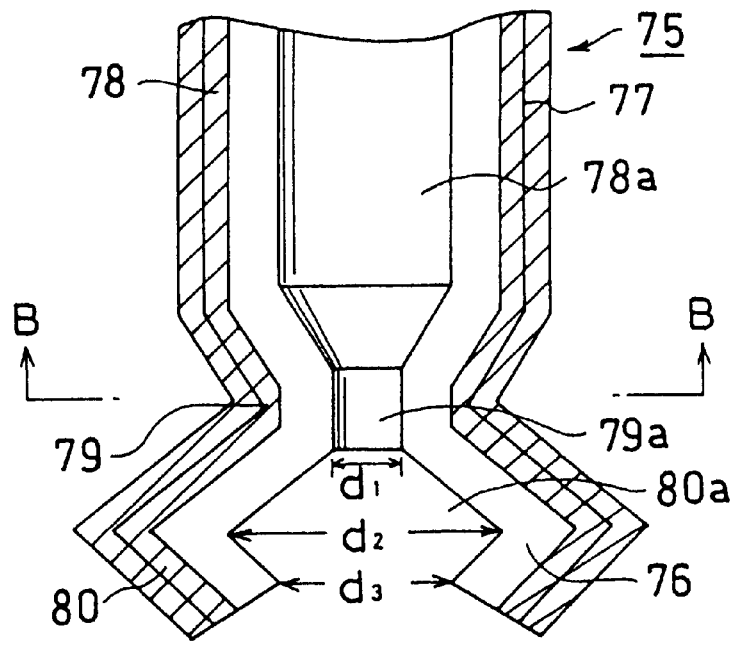
FIG. 15(a) is a longitudinal sectional view diagrammatically showing a seed crystal holder according to another embodiment of the present invention.
Figure 15B:
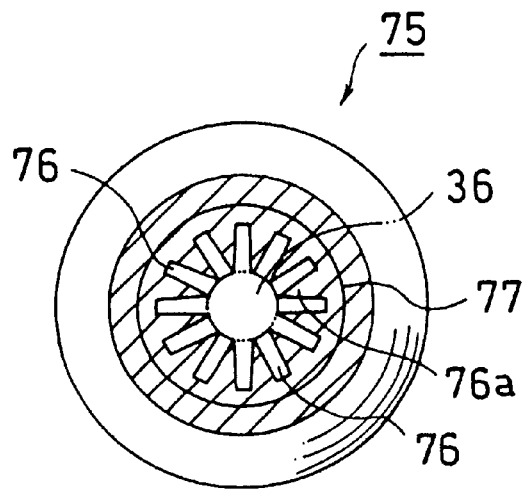
FIG. 15(b) is a horizontal sectional view thereof.

FIG. 15(a) is a longitudinal sectional view diagrammatically showing a seed crystal holder according to another embodiment, and FIG. 15(b) is a B—B line sectional view of the seed crystal holder shown in FIG. 15(a).

The seed crystal holder 75 includes a seed crystal holding portion 78, a neck formation portion 79, and a recess formation portion 80.

In the upper portion of the seed crystal holding portion 78, a groove (not shown) is formed, to which the front portion of a pulling axis 34 is screwed so as to connect the pulling axis 34 to the seed crystal holder 75. A cavity 78a is formed in the seed crystal holding portion 78, in which a cylindrical seed crystal 35 is inserted. In the neck formation portion 79, a cavity 79a is formed next to the cavity 78a in the seed crystal holding portion 78, and next to the cavity 79a in the neck formation portion 79, a cavity 80a having a shape whose diameter is increased, and then reduced (a recess shape), is formed. Around the cavities 78a, 79a, and 80a, except the portion on which the groove is formed, plural slots 76 are formed from the upper portion to the lower portion of the seed crystal holder 75. A boundary portion 76a between the slots 76 is in the form of an acute angle as shown in the sectional view in FIG. 15(b).

The seed crystal holder 75 is made of a material resistant to a melt 33, which is not chemically changed when it is dipped in the melt 33 (excellent in heat resistance) and from which no impurities and the like dissolve into the melt 33. As described below, in order to hold a heavy growing single crystal using the seed crystal holder 75, it is made of a material having a large mechanical strength. As materials having such characteristics, non-oxide ceramics such as boron nitride (BN) and silicon carbide (SiC) are exemplified. Among them, BN is desired since it is extremely resistant to the melt 33. Therefore, the seed crystal holder 75 usually comprises a sintered body of BN, and when a larger strength is required, a reinforcing material 77 may be buried around the slots 76 almost in parallel to the slots 76 as shown in FIG. 15. As reinforcing materials 77, refractory metals such as molybdenum (Mo) and tungsten (W) are exemplified. In FIG. 15, the case wherein the reinforcing material 77 of a metal having a form of a circle in the horizontal sectional view is shown, but in another embodiment, as a reinforcing material, whiskers of SiC and the like may be wholly mingled in the seed crystal holder 75. Alternatively a great number of carbon fibers and the like may be mingled almost in parallel to the slots 76 in the seed crystal holder 75.

The smallest diameter ($d_1$) of the cavity 79a of the neck formation portion 79 is preferably 3–6 mm, the largest diameter ($d_2$) of the cavity 80a of the recess formation portion 80 is preferably 17–50 mm, and the diameter ($d_3$) of the lowest portion of the cavity 80a is preferably 12–45 mm.

When the smallest diameter ($d_1$) of the cavity 79a of the neck formation portion 79 is 3 mm or so, the dislocation induced to the seed crystal 35 can be sufficiently inhibited from propagating, so that a smaller diameter than that is not necessary. On the other hand, when the smallest diameter ($d_1$) thereof exceeds 6 mm, it becomes difficult to inhibit the dislocation induced to the seed crystal 35 from propagating. When the largest diameter ($d_2$) of the cavity 80a of the recess formation portion 80 is less than 17 mm, it is difficult to form a recess 36b (FIG. 16) and hold the single crystal 36. On the other hand, when the largest diameter ($d_2$) thereof exceeds 50 mm, the effect of holding the single crystal 36 does not change, so that it is economically disadvantageous. When the diameter ($d_3$) of the lowest portion of the cavity 80a is less than 12 mm, it is difficult to hold the single crystal 36, while when the diameter ($d_3$) thereof exceeds 45 mm, the effect of holding the single crystal 36 does not change, so that it is economically disadvantageous.

A method for pulling a single crystal 36 using the seed crystal holder 75 is described. FIGS. 16(a)–(c) are partial magnified sectional views showing the seed crystal holder 75 and the vicinity thereof in the steps of the pulling of the single crystal 36 using the seed crystal holder 75.

Although it is not shown in FIG. 16, a seed crystal 35 is inserted in the seed crystal holder 75, and the seed crystal holder 75 is connected to a pulling axis 34 by screwing the upper portion of the seed crystal holder 75 to the pulling axis 34. Then, a material for forming a crystal is melted, an atmosphere in a chamber is regulated and the like in the same manner as described in the Prior Art.

In order to preheat the seed crystal 35, while the pulling axis 34 is rotated on the same axis in the reverse direction of a support shaft 39 (FIG. 1) at a prescribed speed, the seed crystal 35 held by the seed crystal holder 75 is caused to descend close to a melt 33, and part of the seed crystal holder 75 is dipped into the melt 33 (FIG. 16(a)).

An air vent (not shown) is formed in the upper portion of the seed crystal holder 75. When the seed crystal holder 75 is dipped in the melt 33, part of the air in cavities 79a and 80a goes outward through the air vent, while the melt 33 enters into the cavity 79a of the neck formation portion 79. Ar gas flows within the chamber, but the seed crystal 35 which is held inside the seed crystal holder 75 is not easily cooled by Ar gas, so that it can be preheated in a short period of time. By the preheating, the temperature of the seed crystal 35 can be raised close to that of the melt 33.

The seed crystal holder 75 is further caused to descend so as to bring the lower end portion 35a of the seed crystal 35 into contact with the melt 33 (FIG. 16(b)).

Since there is only a small difference between the temperature of the lower end portion 35a of the seed crystal 35 and that of the melt 33 in contact of the seed crystal 35 with the melt 33, a thermal stress caused by the temperature difference does not so work on the seed crystal 35, so that dislocation is not easily induced thereto. As a result, the diameter of a neck 36a may be larger than before.

By pulling the pulling axis 34 at a speed of 2–5 mm/min, a crystal is made to grow from the lower end portion 35a of the seed crystal 35, and by making the diameter thereof smaller than that of the seed crystal 35, the neck 36a is formed within the cavity 79a. By pulling the pulling axis 34 at a speed of 0.1–1.0 mm/min, a recess 36b is formed. Then, in the same manner as in the Prior Art, by pulling the pulling axis 34 at a speed of 0.1–1.0 mm/min, a shoulder 36c is formed (FIG. 16(c)).

When the seed crystal holder 75 is made of a usual material, in the neck 36a formation step and the recess 36b formation step, a crystal easily grows in various directions from the wall portion of the cavities 79a and 80a, so that there is a high probability of the growth of a polycrystal. In the present embodiment, however, since the seed crystal holder 75 comprises a sintered body of BN which is extremely resistant to the melt 33, and a boundary portion 76a between slots 76 has an acute angle form, a crystal does not grow within the slots 76 but grows only from the lower end portion 35a of the seed crystal 35. The crystal grows in the form of a circle in the horizontal sectional view, so as to be in point (line) contact with the point of the boundary portion 76a as shown in FIG. 15(b). Accordingly, the neck 36a is formed under the seed crystal 35, so that the dislocation can be inhibited from propagating from the seed crystal 35 and the single crystal 36 including the recess 36b can be made to grow under the neck 36a. Since the diameter of the portion where the recess 36b formation finishes and the shoulder 36c formation begins (the lowest portion of the recess) is 12–45 mm, the single crystal 36 can be sufficiently held by the recess 36b even in the pulling of a heavy single crystal. In this case, the higher portion than the recess 36b is held by the seed crystal holder 75.

Then, in the same manner as described in the Prior Art, a main body (not shown) is formed, the diameter thereof is reduced, and it is separated from the melt 33, which is the completion of the pulling of the single crystal 36.

In the present embodiment, the slots 76 whose boundary portion 76a is in the form of an acute angle are formed around the cavities 78a, 79a, and 80a, but in another embodiment, the slots 76 in the above form need not be always formed and the slots in another form may be formed.

In still another embodiment, the slots 76 themselves need not be formed and a cavity in the form of a circle in the horizontal sectional view may be formed. In this case, in order to ventilate the inner cavities to the outside, it is desired to form slots for ventilation on the seed crystal.

EXAMPLES AND COMPARATIVE EXAMPLES

The mean load capacities obtained by carrying out the tensile tests on the seed crystal holders according to Examples and Comparative Examples, the number of falls of the single crystals in the pulling of the single crystals using the seed crystal holders, and the existence of the occurrence of heavy metal contamination are described below.

In both Examples and Comparative Examples, the mean load capacity (kgf) is a mean of the results obtained by ten tensile tests. The number of falls of the single crystals shows how many single crystals having a diameter of about 12 inches, a length of about 1000 mm, and a total weight of 300 kg or so fell because of breaks of the seed crystal holders in the thirty pulls of the single crystals using the seed crystals having a diameter of about 10 mm. The existence of heavy metal contamination was examined by gathering the melt remained in the crucible after the pulling and measuring the entrained metal concentration thereof by chemical analysis. The reason why the state of contamination was examined by the above method is that the metal having a low segregation coefficient is concentrated by the pulling, leading to the more precise estimation.

The common growth conditions to every pulling of a single crystal in Examples and Comparative Examples are shown below in Table 1.

TABLE 1

| Size of single crystal | (Diameter) 12 inches × (length) 1000 mm, (weight) 300 kg |
|---|---|
| Material for single crystal | High-purity polycrystal of Si |
| Impurity in seed crystal | P of $1 \times 10^{15}$ /cm$^3$ |
| Heating method | Direct-current resistance heating |
| Atmosphere | 1333.2 Pa. Ar(80 l/min) |
| Rotation speed of single crystal | 20 rpm (reverse to crucible) |
| Rotation speed of crucible | 5 rpm (reverse to single crystal) |

<EXAMPLE 1>

In Example 1, the seed crystal holder 1 shown in FIG. 4 was manufactured on the below conditions.

Material for inner cylindrical body 2: tungsten

Material for carbon cylindrical body 3: C/C material

Joining of inner cylindrical body 2 and carbon cylindrical body 3: by fixing inner cylindrical body 2 in the center with C/C material within the mold and sintering <Comparative Example 1>

In Comparative Example 1, the seed crystal holder 10 shown in FIG. 2 was manufactured on the below conditions.

Material for seed crystal holder 10: C/C material

Method for forming seed crystal holder 10: by filling the mold with C/C material and sintering <Test Results of Example 1 and Comparative Example 1>

The results of the above tests using the seed crystal holders according to Example 1 and Comparative Example 1 are shown in Table 2.

TABLE 2

|  | Mean load capacity (kgf) | Number of falls of single crystal | Heavy metal contamination |
|---|---|---|---|
| Example 1 | 1500 | 0/30 | no |
| Comparative Example 1 | 350 | 4/30 | no |

As obvious from Table 2, the seed crystal holder 10 according to Comparative Example 1 could bear the mean load of 350 kgf. On the other hand, the seed crystal holder 1 according to Example 1 could bear the mean load of 1500 kgf. The strength thereof was a little over four times larger than that in Comparative Example 1.

When the single crystals 36 were pulled using the seed crystal holders 10 according to Comparative Example 1, four single crystals 36 out of thirty fell since the seed crystal holders 10 broke in the middle of the pulling of the single crystals 36. On the other hand, when the single crystals 36 were pulled using the seed crystal holders 1 according to Example 1, no trouble in which the seed crystal holders 1 broke and the single crystals 36 fell occurred in thirty pulls of the single crystals 36.

In both Example 1 and Comparative Example 1, the occurrence of heavy metal contamination was not found.

<Example 2>

In Example 2, the seed crystal holder 50 shown in FIG. 6 was manufactured on the below conditions.

Material for body 20: C/C material

Material for metallic cylindrical body 30: tungsten

Joining of body 20 and metallic cylindrical body 30: by fixing metallic cylindrical body 30 with C/C material in the prescribed position within the mold and sintering <Test Results of Example 2>

The results of the above tests using the seed crystal holders according to Example 2 are shown in Table 3.

TABLE 3

|  | Mean load capacity (kgf) | Number of falls of single crystal | Heavy metal contamination |
|---|---|---|---|
| Example 2 | 1500 | 0/30 | no |

As obvious from Table 3, the seed crystal holder 50 according to Example 1 could bear the mean load of 1500 kgf. The strength thereof was a little over four times larger than that in Comparative Example 1.

When the single crystals 36 were pulled using the seed crystal holders 50 according to Example 2, no trouble in which the seed crystal holders 50 broke and the single crystals 36 fell occurred in thirty pulls of the single crystals 36.

The occurrence of heavy metal contamination was not found.

<Examples 3–5 and Comparative Examples 2 and 3>

Figure 3A:
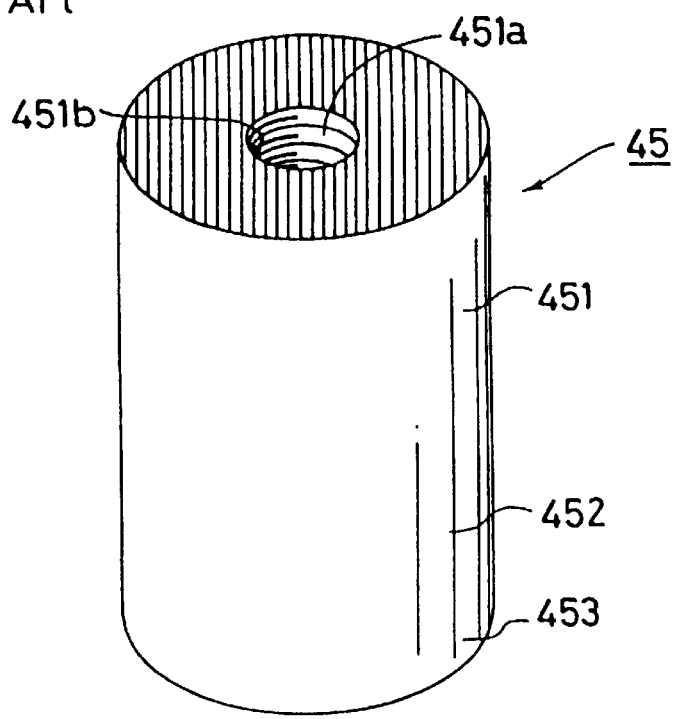
FIG. 3(a) is an oblique view diagrammatically showing a conventional seed crystal holder made of graphite reinforced with carbon fiber cloth.
Figure 3B:
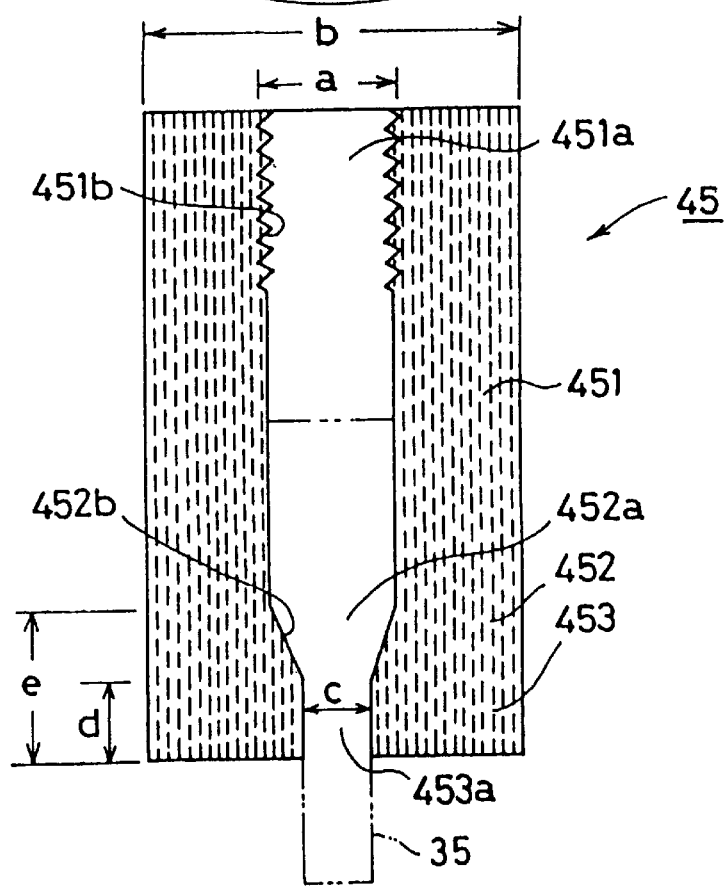
FIG. 3(b) is a sectional view thereof.

The case wherein single crystals (300 kg) were pulled using the seed crystal holders for pulling a single crystal according to Examples shown in FIGS. 8 and 9, and the case wherein the load capacity tests to 200 kgf were carried out, are described below. As Comparative Examples, the case wherein single crystals were pulled using the conventional seed crystal holders 45 for pulling a single crystal shown in FIG. 3 is also described. The conditions and results (the number of falls of crystals in the pulling of single crystals) are shown in Tables 4–7. In every case, seed crystals in the forms which corresponded to those of the cavities in the seed crystal holders were used. In every case, the number of samples was thirty.

TABLE 4

Common conditions to Examples 3–5, and Comparative Examples 2 and 3

Size and weight of single crystal

| Diameter (mm) | Length (mm) | Weight (kg) | Weight of material (kg) | Number of pulls (times) |
| --- | --- | --- | --- | --- |
| 300 (12 in) | 1000 | 270 | 300 | 30 |

TABLE 5

Common conditions to Examples 3–5, and Comparative Examples 2 and 3

| Rotation speed (rpm) | | Conditions in chamber | |
| --- | --- | --- | --- |
| Crystal | Crucible | Flow of Ar (l/min) | Pressure (Pa) |
| 20 | 5 | 80 | 1330 |

TABLE 6

Common conditions to Examples 3–5, and Comparative Examples 2 and 3

Pulling speed in formation of each part of single crystal (mm/min)

| Neck | Shoulder | Main body |
| --- | --- | --- |
| 3 | 0.3 | 0.5 |

TABLE 7

| | Construction of seed crystal holder (Figure) | Dimensions of seed crystal holder (mm) | | | | | | | Mean load capacity of seed crystal holder (kgf) | Number of falls of crystals | State of damage |
| --- | --- | --- | --- | --- | --- | --- | --- | --- | --- | --- | --- |
| | | a | b | c | d | e | f | g | | | |
| Example 3 | FIG. 8 | 20 | 60 | 12 | 10 | 25 | 30 | 8 | >1500 | 0/30 | |
| Example 4 | FIG. 9 | 20 | 60 | 12 | 10 | 25 | — | 8 | >1500 | 0/30 | |
| Example 5 | FIG. 8 | 20 | 60 | 12 | 10 | 25 | 30 | 0.8 | 350 | 4/30 | |
| Comparative Example 2 | FIG. 3 | 20 | 60 | 12 | 10 | 25 | — | — | 214 | 29/30 | Delamination in vertical direction |
| Comparative Example 3 | FIG. 3* | 20 | 60 | 12 | 10 | 25 | — | — | 75 | 30/30 | Delamination in horizontal direction |

Note)
*: In Comparative Example 3, the seed crystal holders in which carbon fiber cloth was laminated in the vertical direction were used.

As obvious from the results shown in Table 7, in Examples 3–5, the load capacities were large and the probabilities of falls of single crystals were low, since the lower outer region 59 or the outer region 61 was made of graphite reinforced with circumferentially arranged carbon fiber cloth and the other regions were made of graphite reinforced with vertically arranged carbon fiber cloth. On the other hand, in Comparative Examples 2 and 3, since the seed crystal holders 45 were wholly made of graphite reinforced with vertically or horizontally arranged carbon fiber cloth, the load capacities were small, so that damage occurred in the seed crystal holders 45 and most of the single crystals fell because of the damage.

<Examples 6–10 and Comparative Examples 4 and 5>

The seed crystal holders for pulling a single crystal and the seed crystals according to Examples 6–10 shown in FIG. 11 are described. As Comparative Examples, the seed crystal holders for pulling a single crystal whose load capacities are small and the seed crystals are also described.

In Examples 6–10 and Comparative Examples 4 and 5, the seed crystal holders 65 in the forms shown in Table 8 were used and the seed crystals 35 having external forms which corresponded to those of the inner wall surfaces of the seed crystal holders 65 were inserted in the seed crystal holders 65. After fixing the seed crystal holders 65 in the tensile tester, the seed crystals 35 were tensed in the vertical direction with a force of 500 kgf, and whether the seed crystal holders 65 and/or seed crystals 35 broke or not was observed. The dimensions of the seed crystal holders 65 and the results of the tensile tests are shown in Table 8. Here, the number of samples used in each tensile test was ten.

TABLE 8

| | Form of seed crystal holder | | | | | Load capacity by calculation (kgf) | Results of tensile tests | |
|---|---|---|---|---|---|---|---|---|
| | 2r (mm) | R (mm) | d (mm) | θ (°) | l (mm) | S (mm²) | | number of broken seed crystal holders | number of broken seed crystals |
| Example 6 | 15 | 4 | 10 | 82 | 12 | 1019 | 697 | 0/10 | 0/10 |
| Example 7 | 15 | 6 | 20 | 75 | 12 | 1654 | 624 | 0/10 | 0/10 |
| Example 8 | 15 | 25 | 20 | 18 | 12 | 1608 | 516 | 0/10 | 0/10 |
| Example 9 | 15 | 20 | 15 | 8 | 12 | 981 | 670 | 0/10 | 2/10 |
| Example 10 | 15 | 3 | 7 | 87 | 12 | 1213 | 2188 | 0/10 | 0/10 |
| Comparative Example 4 | 15 | 4 | 5 | 82 | 12 | 615 | 420 | 10/10 | 10/10 |
| Comparative Example 5 | 15 | 8 | 13 | 60 | 12 | 975 | 212 | 10/10 | 10/10 |

Note) In Example 10, four seed crystals cut into the seed crystal holders and could not be disconnected.

As obvious from the results shown in Table 8, in Examples 6–10, by substituting every dimension of the seed crystal holders 65 on the left side of Formula 1, the load capacities are 500 kgf or more on calculation. In every case, it was established by the actual tensile tests that the load capacity was 500 kgf or more.

In Comparative Examples 4 and 5, the load capacities are less than 500 kgf on calculation, and in the actual tensile tests, all of the seed crystal holders 65 and seed crystals 35 broke.

<Examples 11–14 and Comparative Example 6>

The seed crystals for pulling a single crystal according to Examples 11–14 shown in FIG. 14 are described below. As a Comparative Example, the case wherein single crystals were pulled using the conventional seed crystals for pulling a single crystal is also described. The conditions and results (the number or falls of crystals in the pulling of single crystals) are shown in Tables 9–12.

TABLE 9

Common conditions of Examples 11–14 and Comparative Example 6

Size and weight of single crystal

| Diameter (mm) | Length (mm) | Weight (kg) | Weight of material (kg) | Number of pulls (times) |
|---|---|---|---|---|
| 300 (12 in) | 1000 | 270 | 300 | 30 |

TABLE 10

Common conditions of Examples 11–14 and Comparative Example 6

| Rotation speed (rpm) | | Conditions in chamber | |
|---|---|---|---|
| Crystal | Crucible | Flow of Ar (l/min) | Pressure (Pa) |
| 20 | 5 | 80 | 1330 |

TABLE 11

Common conditions of Examples 11–14 and Comparative Example 6

Pulling speed in formation of each part of single crystal (mm/min)

| Neck | Shoulder | Main body |
|---|---|---|
| 3 | 0.3 | 0.5 |

TABLE 12

| | Form of seed crystal | | Dimension of seed crystal (mm) | | | | | Surface treatment | | Number of falls of crystals |
|---|---|---|---|---|---|---|---|---|---|---|
| | figure | Section form of middle portion | a | b | c | d | e | Treated or not | Unevenness | |
| Example 11 | shown in FIG. 14 | R (diameter: 110 mm) | 22 | 14 | 70 | 30 | 100 | Treated | 50 μm and less | 0/30 |
| Example 12 | shown in FIG. 14 | R (diameter: 110 mm) | 22 | 14 | 70 | 30 | 100 | Treated | 100 μm and less | 1/30 |
| Example 13 | shown in FIG. 14 | Straight line | 22 | 14 | 70 | 30 | 100 | Treated | 50 μm and less | 3/30 |

TABLE 12-continued

| | Form of seed crystal | | Dimension of seed crystal (mm) | | | | | Surface treatment | | Number of falls of crystals |
|---|---|---|---|---|---|---|---|---|---|---|
| | figure | Section form of middle portion | a | b | c | d | e | Treated or not | Unevenness | |
| Example 14 | shown in FIG. 14 | R (diameter: 110 mm) | 22 | 14 | 70 | 30 | 100 | Not Treated | 150 μm or more | 5/30 |
| Comparative Example 6 | shown in FIG. 14 | Straight line | 22 | 14 | 70 | 30 | 100 | Not Treated | 150 μm or more | 25/30 |

As obvious from the results shown in Table 12, in Examples 11 and 12, the number of falls of the single crystals 36 in the middle of the pulling was 0/30 and 1/30, respectively, that is, the probabilities were extremely low, since the vertical sectional forms of the middle portions 16b included circular arcs and the surfaces were treated. In Example 14 wherein the seed crystals 16 having the same forms as those in Example 11 were used without the surface treatment, the number of falls of the single crystals 36 in the middle of the pulling was increased to 5/30, but about 83% of the single crystals 36 could be pulled without falling. In Example 12, the number of falls of the single crystals 36 in the middle of the pulling was 3/30, that is, the probability was low, since the vertical sectional forms of the middle portions 16b included only straight lines but the surfaces were treated.

On the other hand, in Comparative Example 6, the number of falls of the single crystals 36 in the middle or the pulling was 25/30, that is, the probability was high, 83%, since the vertical sectional forms of the middle portions 16b included only straight lines and the unevenness of the surfaces was 150 μm or more.

<Examples 15 and 16, and Comparative Examples 7 and 8>

The seed crystal holders according to Examples 15 and 16 shown in FIG. 16 and the method for pulling a single crystal using the seed crystal holders are described below. As Comparative Examples, the cases wherein a single crystal is pulled by a conventional method using the conventional apparatus for pulling a single crystal used for the CZ method (FIG. 1) are also described. The conditions are shown in Tables 13–18.

TABLE 13

Common conditions to Examples 15 and 16, and Comparative Examples 7 and 8

Form of single crystal

| Diameter (mm) | Length (mm) | Weight (kg) | Weight of material (kg) | Number of pulls (times) |
|---|---|---|---|---|
| 300 (12 in) | 1000 | 270 | 300 | 30 |

TABLE 14

Common conditions to Examples 15 and 16, and Comparative Examples 7 and 8

| Rotation speed (rpm) | | Conditions in chamber | |
|---|---|---|---|
| Crystal | Crucible | Flow of Ar (l/min) | Pressure (Pa) |
| 20 | 5 | 80 | 1330 |

TABLE 15

Other conditions

| Seed crystal holder | Material | Reinforcing material | Neck formation portion (mm) | | Slot depth (mm) | Angle of boundary portion 76a (°) |
|---|---|---|---|---|---|---|
| | | | Outer diameter | Smallest diameter of cavity ($d_1$) | | |
| Example 15, 16 | BN sintered body (Density 1.9–2 g/cm$^3$) | Mo (Thickness 1 mm) | 10 | 4 | 10 | 40–50 |

TABLE 16

| Seed crystal holder | Other conditions Cavity of recess formation portion (mm) | |
|---|---|---|
| | Largest diameter ($d_2$) | Diameter of lowest portion ($d_2$) |
| Example 15 | 30 | 12 |
| Example 16 | 30 | 15 |

TABLE 17

| | Other conditions | | | |
|---|---|---|---|---|
| | Diameter of seed crystal (mm) | Smallest diameter of neck (mm) | Distance between seed crystal lower end and melt surface in preheating (mm) | Preheating time (min) |
| Example 15, 16 | 12 | — | 1 | 30 |
| Comparative Example 7 | 12 | 4 | 1 | — |
| Comparative Example 8 | 12 | 10 | 1 | — |

TABLE 18

| | Other conditions | | | |
|---|---|---|---|---|
| | Pulling speed in formation of each part of single crystal (mm/min) | | | |
| | Neck | Recess | Shoulder | Main body |
| Example 15, 16 | 3 | 0.4 | 0.3 | 0.5 |
| Comparative Example 7 | 3 | — | 0.3 | 0.5 |
| Comparative Example 8 | 3 | — | 0.3 | 0.5 |

<How to Examine DF (Dislocation Free) Rate of Pulled Single Crystals>

The pulled single crystals 36 were sliced in parallel to the growth direction (length direction), and X-ray topographies of the obtained single crystals 36 were measured, from which the DF rate was judged. That is, the single crystals 36, in which dislocation was found even slightly from the X-ray topographies, were judged as having dislocation. The rate of dislocation-free single crystals in thirty pulled single crystals was examined by the above measurement.

<Results of Examples 15 and 16, and Comparative Examples 7 and 8>

The DF rates and the number of falls of the single crystals 36 are shown in Table 19.

TABLE 19

| | DF rate (%) | Number of falls |
|---|---|---|
| Example 15 | 93% (28/30) | 0/30 |
| Example 16 | 97% (29/30) | 0/30 |
| Comparative | 90% (27/30) | 24/30 |

TABLE 19-continued

| | DF rate (%) | Number of falls |
|---|---|---|
| Example 7 Comparative Example 8 | 0% (0/30) | 0/30 |

As obvious from the results shown in Table 19, in Examples 15 and 16, the DF rates of the pulled single crystals 36 were 93% (28/30) and 97% (29/30); respectively, that is, little dislocation was induced, since the dislocation could be inhibited from propagating from the seed crystal 35 by forming a neck 36a. Since the diameters ($d_3$) of the lowest portions of the recesses 36b were sufficiently large, 12 mm and 15 mm, respectively, the number of falls was 0/30.

On the other hand, in Comparative Example 7, since the diameters of the seed crystals 35 were narrowed to make the neck 36a have a diameter of 4 mm, the DF rate was favorably 90% (27/30). But the single crystals 36 could not be supported sufficiently, resulting in the number of falls of 24/30, that is, the falling or most of the single crystals 36. In Comparative Example 8, since the diameters of the necks 36a were 10 mm, large, the number of falls was 0/30. But since the dislocation induced to the seed crystals 35 could not be excluded, the DF rate was 0% (0/30), that is, the dislocation was induced to all of the single crystals 36.

What is claimed is:

1. A seed crystal holder, comprising an inner cylindrical body made of metal which directly holds a seed crystal, and a carbon cylindrical body arranged around the inner cylindrical body to cover the periphery of the inner cylindrical body.

2. A seed crystal holder, wherein a metallic cylindrical body is buried at least in the portion to surround a seed crystal.

3. A seed crystal holder for pulling a single crystal, which is made of graphite reinforced with carbon fibers and has a cavity in the form corresponding to the external form of a seed crystal, wherein carbon fibers are wound in the circumferential direction at least to the lower outer region, and are arranged in the vertical direction in the other regions.

4. A seed crystal holder for pulling a single crystal, which is made of graphite reinforced with carbon fiber cloth, comprising the upper portion having a large-diameter cavity, the lower portion having a small-diameter cavity, and the middle portion joining the upper portion to the lower portion, wherein when an angle of the inner wall surface of the middle portion to the horizontal plane, a vertical cross-sectional area of the middle and lower portions, a tensile strength between laminae of graphite reinforced with carbon fiber cloth, and a load of a pulled single crystal are θ, S, δ, and W, respectively, each value of θ, S, and δ are chosen so as to satisfy Formula 1

$$\pi \sigma S/(\sin\theta \cdot \cos\theta) > W \qquad \text{(Formula 1)}.$$

5. A seed crystal holder for pulling a single crystal, defined in claim 4, wherein the angle (θ) of the inner wall surface of the middle portion to the horizontal plane is chosen in the range of 20–85°.

6. A seed crystal holder, which is made of a material resistant to a melt, comprising a seed crystal holding portion, a neck formation portion, and a recess formation portion wherein the diameter is increased after the neck formation and is reduced.

7. A seed crystal holder, defined in claim 6, wherein plural slots are formed from the upper portion to the lower portion.

8. A seed crystal holder, defined in claim 6 or 7, wherein a boundary portion between slots has an acute angle form in the horizontal sectional view.

9. A seed crystal holder, defined in claim 8, which is reinforced with a reinforcing material.

10. A seed crystal holder, defined in claim 6 or 7, which is reinforced with a reinforcing material.

* * * * *